(12) United States Patent
Li

(10) Patent No.: US 9,029,170 B2
(45) Date of Patent: *May 12, 2015

(54) MAGNETIC TUNNEL JUNCTION STRUCTURE

(71) Applicant: QUALCOMM Incorporated, San Diego, CA (US)

(72) Inventor: Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/734,685

(22) Filed: Jan. 4, 2013

(65) Prior Publication Data

US 2013/0119497 A1   May 16, 2013

Related U.S. Application Data

(60) Continuation of application No. 12/041,957, filed on Mar. 4, 2008, now Pat. No. 7,579,197, which is a division of application No. 12/546,610, filed on Aug. 24, 2009, now Pat. No. 8,634,231.

(51) Int. Cl.
*H01L 21/00* (2006.01)
*H01L 21/67* (2006.01)
*G11C 11/16* (2006.01)
(Continued)

(52) U.S. Cl.
CPC ..... *H01L 21/67011* (2013.01); *Y10T 29/53165* (2013.01); *G11C 11/16* (2013.01); *H01L 27/228* (2013.01); *H01L 43/08* (2013.01); *H01L 43/12* (2013.01); *H01L 29/66007* (2013.01); *H01L 29/82* (2013.01)

(58) Field of Classification Search
CPC .. H01L 29/82; H01L 29/66007; H01L 27/228
USPC .................... 438/3, 48, 59, 85, 131, 197, 240
See application file for complete search history.

(56) References Cited

U.S. PATENT DOCUMENTS 5,801,984 A   9/1998  Parkin
6,072,718 A   6/2000  Abraham et al.
(Continued)

FOREIGN PATENT DOCUMENTS

CN     1479945 A     3/2004
CN   101051620 A    10/2007
(Continued)

OTHER PUBLICATIONS

European Search Report—EP11186235—Search Authority—Munich—Feb. 9, 2012.
(Continued)

*Primary Examiner* — Long K Tran
(74) *Attorney, Agent, or Firm* — Donald D. Min

(57) ABSTRACT

A magnetic tunnel junction (MTJ) device is formed by a process that includes forming a trench in a substrate and depositing an MTJ structure within the trench. The MTJ structure includes a bottom electrode, a fixed layer, a tunnel barrier layer, a free layer, and a top electrode. The process includes applying reverse photo etching to remove material that is not directly over the trench. The process also includes plagiarizing the MTJ structure without performing a photo-etch process on the MTJ structure.

17 Claims, 17 Drawing Sheets

(51) Int. Cl.
  *H01L 43/08*   (2006.01)
  *H01L 43/12*   (2006.01)
  *H01L 29/66*   (2006.01)
  *H01L 29/82*   (2006.01)
  *H01L 27/22*   (2006.01)

(56) References Cited

U.S. PATENT DOCUMENTS

| | | | | |
|---|---|---|---|---|
| 6,114,719 | A * | 9/2000 | Dill et al. | 257/295 |
| 6,709,973 | B1 | 3/2004 | Sakamoto | |
| 6,734,080 | B1 * | 5/2004 | Yang et al. | 438/427 |
| 6,841,820 | B2 | 1/2005 | Komuro et al. | |
| 6,884,729 | B2 | 4/2005 | Lee et al. | |
| 7,109,539 | B2 | 9/2006 | Lu | |
| 7,579,197 | B1 * | 8/2009 | Li | 438/3 |
| 7,885,105 | B2 | 2/2011 | Li et al. | |
| 7,936,596 | B2 | 5/2011 | Li | |
| 2002/0137307 | A1 * | 9/2002 | Kim et al. | 438/432 |
| 2002/0153547 | A1 | 10/2002 | Kajiyama | |
| 2003/0151020 | A1 | 8/2003 | Lee et al. | |
| 2004/0052131 | A1 | 3/2004 | Komuro et al. | |
| 2004/0174740 | A1 | 9/2004 | Lee et al. | |
| 2005/0045931 | A1 | 3/2005 | Min et al. | |
| 2005/0095855 | A1 | 5/2005 | Durso et al. | |
| 2006/0033133 | A1 | 2/2006 | Liu et al. | |
| 2006/0081752 | A1 | 4/2006 | Ke | |
| 2006/0081952 | A1 * | 4/2006 | Lin | 257/421 |
| 2007/0176251 | A1 | 8/2007 | Oh et al. | |
| 2009/0059656 | A1 * | 3/2009 | Kanakasabapathy et al. | 365/158 |
| 2009/0091863 | A1 | 4/2009 | Hosotani et al. | |
| 2009/0174015 | A1 * | 7/2009 | Gu et al. | 257/421 |
| 2009/0290410 | A1 * | 11/2009 | Wang et al. | 365/158 |
| 2011/0044096 | A1 | 2/2011 | Li | |
| 2013/0062767 | A1 * | 3/2013 | Chang et al. | 257/741 |
| 2014/0011298 | A1 | 1/2014 | Li | |

FOREIGN PATENT DOCUMENTS

| | | |
|---|---|---|
| EP | 1622160 A2 | 2/2006 |
| JP | 2001168418 A | 6/2001 |
| JP | 2001284679 A | 10/2001 |
| JP | 2003133529 A | 5/2003 |
| RU | 2124765 C1 | 1/1999 |
| RU | 2281567 C2 | 8/2006 |
| WO | 9428552 A1 | 12/1994 |
| WO | 03107351 A1 | 12/2003 |
| WO | 2006051816 A1 | 5/2006 |

OTHER PUBLICATIONS

Gallagher, P.: "Development of the Magnetic Tunnel Junction MRAM at IBM: from first junctions to a 16-Mb MRAM demonstrator chip," IBM J. Res. & Dev. vol. 50, No. 1, Jan. 2006, 0018-8646/06 2006 IBM.

International Search Report—PCT/US09/034836, International Search Authority—European Patent Office—Jun. 15, 2009.

Kasko I et al.: "Method of Fabricating Magnetic Random Access Memory (MTJ Patterning by Collimated Deposition and CMP)" IP.com Journal, IP.com Inc., West Henrietta, NY, US, (Sep. 24, 2003), XP013012981.

Kimura, H. et al.: "A Study of Multiple-Valued Magnetoresistive RAM (MRAM) Using Binary MTJ Devices," Graduate School of Information Sciences, Tohoku University, Aoba-Yama 05, Sendai 980-8579, Japan and Department of Electrical and Computer Engineering, University of Toronto, 10 Kings"s College Road, Toronto, ON M5S 3G4, Canada, May 19-22, 2004, 6 pages.

"MRAM Fact Sheet," Document Number: MRAMTECHFS, Rev 6, Freescale Semiconductor, Inc. 2007.

Written Opinion-PCT/US09/034836, International Search Authority—European Patent Office—Jun. 15, 2009.

Taiwan Search Report—TW098107006—TIPO—Oct. 23, 2012.

European Search Report—EP14172443—Search Authority—Munich—Oct. 21, 2014.

* cited by examiner

MAGNETIC TUNNEL JUNCTION STRUCTURE

I. CLAIM OF PRIORITY

The present application claims priority from and is a divisional of U.S. patent application Ser. No. 12/546,610, filed Aug. 24, 2009, which claims priority from and is a continuation of U.S. patent application Ser. No. 12/041,957 filed Mar. 4, 2008, now issued as U.S. Pat. No. 7,579,197, both of which are incorporated herein by reference in their entireties.

II. FIELD

The present disclosure is generally related to a magnetic tunnel junction (MTJ) structure.

III. DESCRIPTION OF RELATED ART

In general, widespread adoption of portable computing devices and wireless communication devices has increased demand for high-density and low-power non-volatile memory. As process technologies have improved, it has become possible to fabricate magneto-resistive random access memory (MRAM) based on magnetic tunnel junction (MTJ) devices. Traditional spin torque tunnel (STT) junction devices are typically formed as flat stack structures. Such devices typically have two-dimensional magnetic tunnel junction (MTJ) cells with a single magnetic domain. An MTJ cell typically includes a bottom electrode, an anti-ferromagnetic layer, a fixed layer (i.e., a reference layer formed from a ferromagnetic material that carries a magnetic field having a fixed or pinned orientation by an anti-ferromagnetic (AF) layer), a tunnel barrier layer (i.e., a tunneling oxide layer), a free layer (i.e., a second ferromagnetic layer that carries a magnetic field having a changeable orientation), and a top electrode. The MTJ cell represents a bit value by a magnetic field induced in the free layer. A direction of the magnetic field of the free layer relative to a direction of a fixed magnetic field carried by the fixed layer determines the bit value.

Typically, the magnetic tunnel junction (MTJ) cell is formed by depositing multiple layers of material, by defining a pattern onto the layers, and by selectively removing portions of the layers according to the pattern. Conventional MTJ cells are formed to maintain an aspect ratio of length (a) to width (b) that is greater than one in order to maintain a magnetic isotropic alignment. Conventionally, the aspect ratio of the MTJ cells is maintained by controlling an accuracy of the MTJ pattern and by performing an MTJ photo and etch process. In a particular instance, a hard mask may be used to transfer and define the MTJ pattern accurately. Unfortunately, the MTJ stack may include magnetic films that are basically metal films and that have a relatively slow etch rate, so the hard mask may need to be relatively thick. For advance pattern critical dimension (CD) control, advanced patterning film (APF) and bottom anti-reflection coating (BARC) layers are included in the MTJ photo and etch process. However, while these additional layers increase process complexity (both in terms of additional deposition processes and in terms of additional layer photo/etch and clean processes), the MTJ cell structure may experience erosion, which may result in an undesired slope, corner rounding, and undesired film loss. Such damage can impact a contact resistance of the MTJ structure and potentially even expose or damage the MTJ junction.

IV. SUMMARY

In a particular illustrative embodiment, a magnetic tunnel junction (MTJ) device formed by a process is disclosed. The process includes forming a trench in a substrate. The process further includes depositing an MTJ structure within the trench. The MTJ structure includes a bottom electrode, a fixed layer, a tunnel barrier layer, a free layer, and atop electrode. The process includes applying reverse photo etching process to remove material that is not directly over the trench. The process also includes planarizing the MTJ structure without performing a photo-etch process on the MTJ structure.

In another particular embodiment, a magnetic tunnel junction (MTJ) structure is disclosed that includes a bottom electrode, a fixed layer, a tunnel barrier layer, a free layer, and atop electrode. The bottom electrode is coupled to a bottom surface of the fixed layer and extends along at least one sidewall of the fixed layer.

One particular advantage provided by embodiments of the disclosed methods of forming a magnetic tunnel junction (MTJ) structure is that oxidation, erosion and corner rounding can be reduced by using a trench to define dimensions of the MTJ structure without photo/etching the MTJ structure. In general, the trench is formed in an oxide base substrate, which is easier to photo-etch than the MTJ metal films. Further, it is easier to precisely photo-etch the oxide base substrate than the metal layers. Instead, a reverse trench photo-etch process and a Chemical-Mechanical Planarization (CMP) process can be used to remove excess material, without introducing erosion, corner rounding or other issues that may impact performance of the MTJ structure.

Another particular advantage is provided in hat a process window for formation of MTJ structures is improved, i.e., enlarged, and the overall reliability of MTJ process and resulting MTJ structure is also improved.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1:
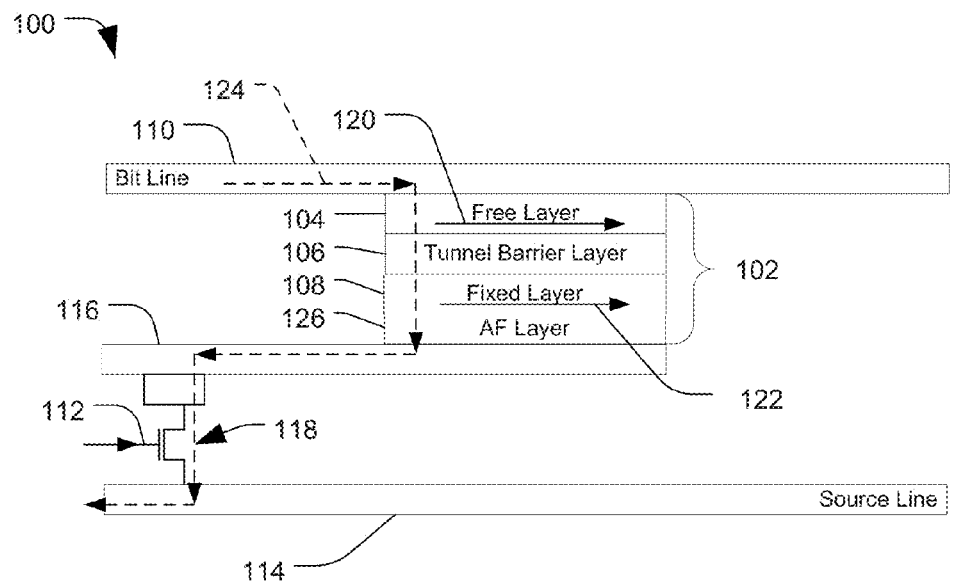
FIG. 1 is a diagram of a representative: example of a magnetic tunnel junction (MTJ) cell.

FIG. 1 is a cross-sectional view of a particular embodiment of a portion of a magnetic tunnel junction (MTJ) cell 100, which may be formed according to the methods and embodiments described with respect to FIGS. 3-24. The MTJ cell 100 includes an MTJ stack 102 having a free layer 104, a tunnel barrier layer 106, a fixed (pinned) layer 108, and an anti-ferromagnetic (AF) layer 126. The MTJ stack 102 is coupled to a bit line 110. Further, the MTJ stack 102 is coupled to a source line 114 via a bottom electrode 116 and a switch 118. A word line 112 is coupled to a control terminal of the switch 118 to selectively activate the switch 118 to allow a write current 124 to flow from the bit line 110 to the source line 114. In the embodiment shown, the fixed layer 108 includes a magnetic domain 122 that has a fixed orientation. The free layer 104 includes a magnetic domain 120, which is programmable via the write current 124. As shown, the write current 124 is adapted to program the orientation of the magnetic domain 120 at the free layer 104 to a zero state (i.e., the magnetic domains 120 and 122 are oriented in the same direction). To write a one value to the MTJ cell 100, the write current 124 is reversed, causing the orientation of the magnetic domain 120 at the free layer 104 to flip directions, such that the magnetic domain 120 extends in a direction opposite to that of the magnetic domain 122.

Figure 2:
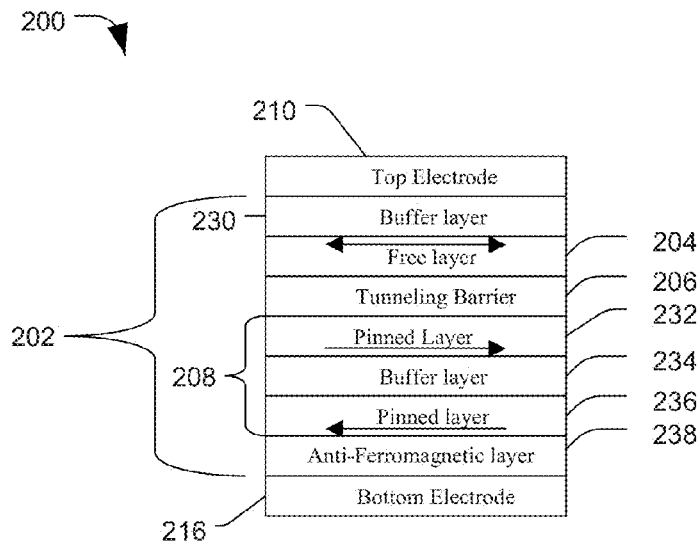
FIG. 2 is a block diagram of a circuit device including a representative embodiment of a magnetic tunnel junction (MTJ) cell including a top electrode, an MTJ stack, and a bottom electrode.

FIG. 2 is a cross-sectional view of another particular embodiment of an MTJ cell 200, which includes a synthetic fixed layers structure and which may be formed according to the methods and embodiments described with respect to FIGS. 3-24. In particular, the MTJ cell 200 includes an MTJ stack 202 including the free layer 204, the tunnel barrier layer 206, and the fixed layer 208. The free layer 204 of the MTJ stack is coupled to the top electrode 210 via a buffer layer 230. In this example, the fixed layer 208 of the stack 202 is coupled to the bottom electrode 216 via an anti-ferromagnetic layer 238. Additionally, the fixed layer 208 includes a first pinned (fixed) layer 236, a buffer layer 234, and a second pinned (fixed) layer 232. The first and second pinned layers 236 and 232 have respective magnetic domains which are oriented in opposing directions in a synthetic fixed layer structure, thereby increasing an overall resistance and balancing magnetic stray field of the MTJ stack 202. In a particular embodiment, such stray field reduction can balance a magnetic field of the MTJ stack 202. In other embodiments, additional layers may be included, such as one or more seed layers; buffer layers; stray field balance layers; connection layers; performance enhancement layers, such as synthetic fixed layers, synthetic free (SyF) layers, or dual spin filter (DSF); or any combination thereof.

Figure 3:
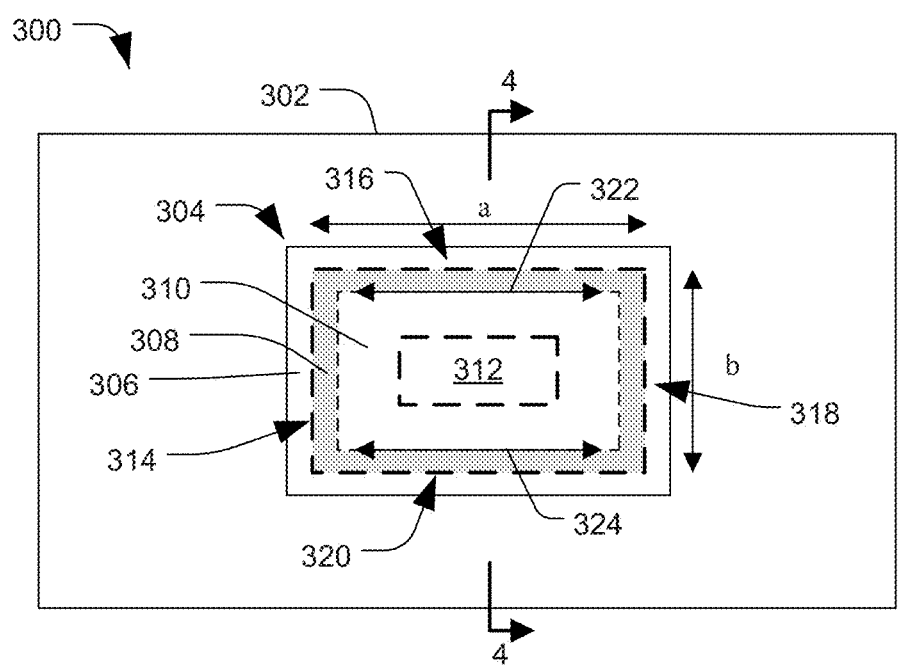
FIG. 3 is a top view of a particular illustrative embodiment of a circuit device including a magnetic tunnel junction (MTJ) cell having a substantially rectangular shape.

FIG. 3 is a top view of a particular illustrative embodiment of a circuit device 300 including a magnetic tunnel junction (MU) cell 304 having a substantially rectangular shape. The circuit device 300 includes a substrate 302 that has the MTJ cell 304. The MTJ cell 304 includes a bottom electrode 306, an Mil stack 308, a center electrode 310, and a via 312. The MTJ cell 304 has a first sidewall 314, a second sidewall 316, a third sidewall 318, and a fourth sidewall 320. The second sidewall 316 includes a second magnetic domain 322 to represent a first data value and the fourth sidewall 320 includes a fourth magnetic domain 324 to represent a second data value. A bottom wall (not shown) may include a bottom magnetic domain 446 (see FIG. 4) to represent another data value. The first and third sidewalls 314 and 318 may also carry magnetic domains, depending on a particular implementation.

The MTJ cell 304 has a length (a) and a width (b). The length (a) corresponds to the length of the second and fourth sidewalls 316 and 320. The width (b) corresponds to the length of the first and third sidewalls 314 and 318. In this particular example, the length (a) of the MTJ cell 304 is greater than the width (b).

Figure 4:
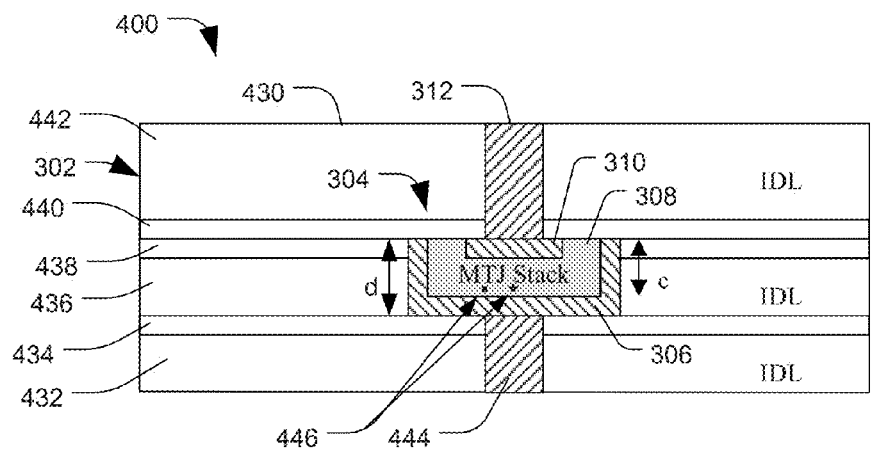
FIG. 4 is a cross-sectional view of the circuit device of FIG. 3 taken along line 4-4 in FIG. 3.

FIG. 4 is a cross-sectional view 400 of the circuit device 300 of FIG. 3 taken along line 4-4 in FIG. 3. The view 400 includes the substrate 302 shown in cross-section including the MTJ cell 304, the via 312, the top electrode 310, the MTJ stack 308, and the bottom electrode 306. The substrate 302 includes a first inter-layer dielectric layer 432, a first cap layer 434, a second inter-layer dielectric layer 436, a second cap layer 438, a third cap layer 440, and a third inter-layer dielectric layer 442.

A trench is formed in the second cap layer 438 and the second inter-layer dielectric layer 436 to receive the bottom electrode 306, the MTJ stack 308, and the top electrode 310. The trench has a trench depth (d) and the MTJ stack 308 has a depth (c) that is approximately equal to the trench depth (d) minus a thickness of the bottom electrode 306. A bottom via 444 extends through the first cap layer 434 and the first inter-layer dielectric layer 432 and is coupled to the bottom electrode 306. The via 312 extends from a surface 430 of the substrate 302 through the third inter-layer dielectric layer 442 and the third cap layer 440 and is coupled to the top electrode 310. The surface 430 may be a substantially planar surface.

Figure 5:
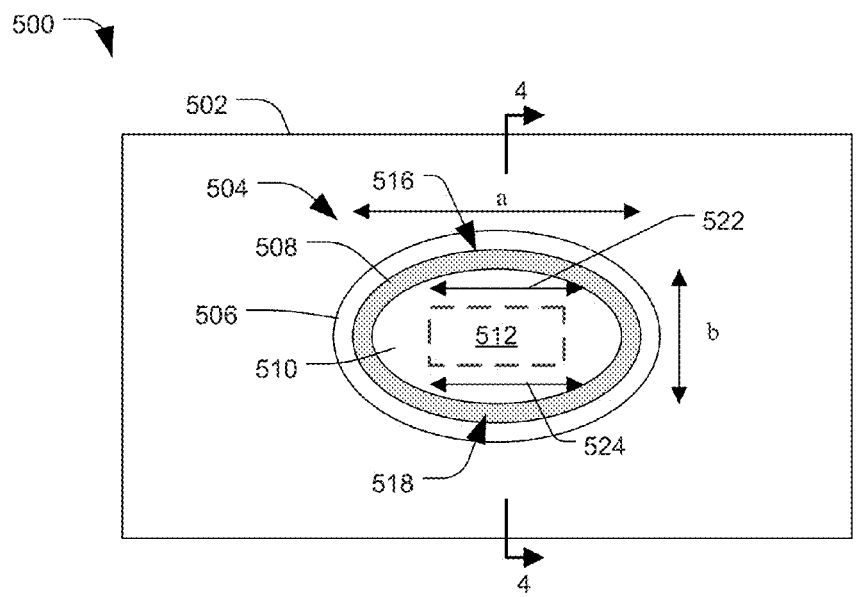
FIG. 5 is a top view of a second particular illustrative embodiment of a circuit device including a magnetic tunnel junction (MTJ) cell having a substantially elliptical shape.

FIG. 5 is a top view of a second particular illustrative embodiment of a circuit device 500 including a magnetic tunnel junction (MTJ) cell 504 having a substantially elliptical shape. The circuit device 500 includes a substrate 502 having the MTJ cell 504. The. MTJ cell 504 includes a bottom electrode 506, an MTJ stack 508, a top electrode 510, and a via 512 that extends from a surface (such as the surface 430 illustrated in FIG. 4) to the top electrode 510. The MTJ cell 504 includes a first sidewall 516 and a second sidewall 518, which are adapted to carry independent magnetic domains 522 and 524, respectively. A respective orientation of each of the independent magnetic domains 522 and 524 may represent a respective data value. In addition, the MTJ cell 504 may include a bottom wall adapted to carry another independent magnetic domain, such as the bottom domain 446 of FIG. 4, which may represent another data value.

The MTJ cell 504 includes a length (a) and a width (1) where the length (a) is greater than the width (b). In a particular embodiment, the cross-sectional view of FIG. 4 may also represent a cross-section taken along lines 4-4 in FIG. 5. In this example, the MTJ cell 504 may be formed within a trench having a depth (d) such that the MTJ cell 504 has a depth (c), as illustrated in FIG. 4. In this particular example, the MTJ cell 504 may be formed such that the length (a) is greater than the width (h) and the width (b) is much greater than the trench depth (d) or the MTJ cell depth (c). Alternatively, the MTJ cell 504 may be formed such that the MTJ cell 504 has a trench depth (d) that is greater than the MTJ cell depth (c), which in turn is greater than the length (a), as illustrated in FIGS. 6 and 7.

Figure 6:
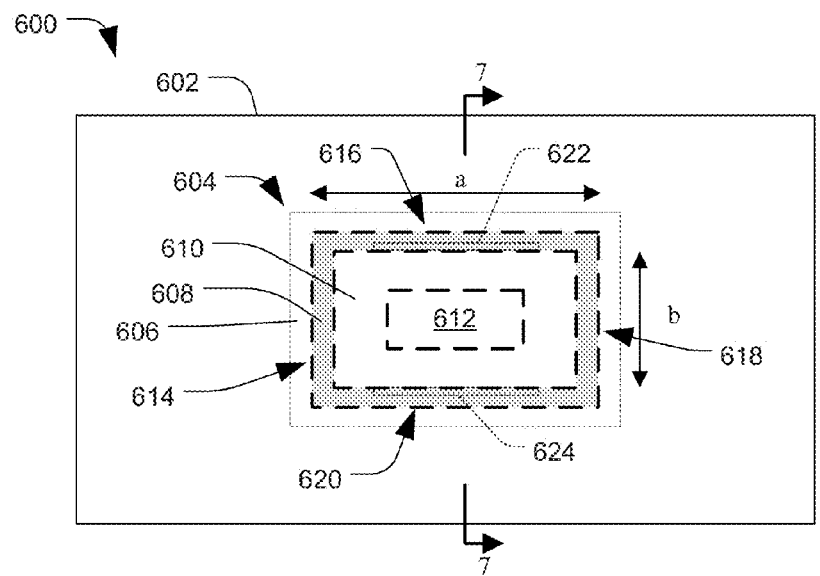
FIG. 6 is a top view of a third particular illustrative embodiment of a circuit device including a magnetic tunnel junction (MTJ) cell.

FIG. 6 is a top view of a third particular illustrative embodiment of a circuit device 600 including a magnetic tunnel junction (MTJ) cell 604. The circuit device 600 includes a substrate 602 that has the MTJ cell 604. The MTJ cell 604 includes a bottom electrode 606, an MTJ stack 608, a center electrode 610 and a via 612. The MTJ cell 604 has a first sidewall 614, a second sidewall 616, a third sidewall 618, and a fourth sidewall 620. The second sidewall 616 includes a second magnetic domain 622 adapted to represent a first data value and the fourth sidewall 620 includes a fourth magnetic domain 624 adapted to represent a second data value. A bottom wall 770 may include a bottom magnetic domain 772, as depicted in FIG. 7. The first and third sidewalls 614 and 618 may also carry magnetic domains, depending on the particular implementation.

The MTJ cell 604 has a length (a) and a width (b). The length (a) corresponds to the length of the second and fourth sidewalls 616 and 620. The width (b) corresponds to the length of the first and third sidewalls 614 and 618. In this particular example, the length (a) of the MTJ cell 604 is greater than the width (b).

Figure 7:
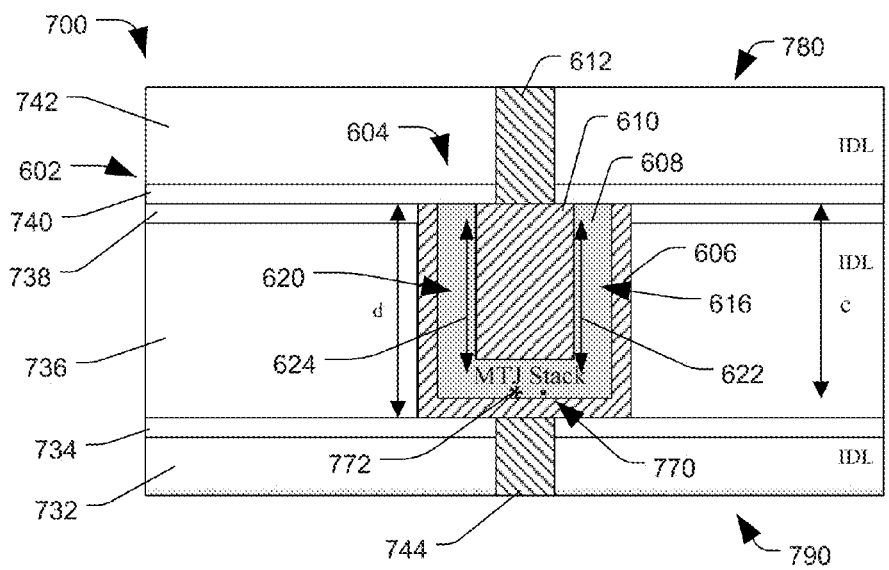
FIG. 7 is a cross-sectional view of the circuit device of FIG. 6 taken along line 7-7 in FIG. 6.

FIG. 7 is a cross-sectional view of the circuit device of FIG. 6 taken along line 7-7 ire FIG. 6. The view 700 includes the substrate 602 shown in cross-section including the MTJ cell 604, the via 612, the top electrode 610, the MTJ stack 608, and the bottom electrode 606. The substrate 602 includes a first inter-layer dielectric layer 732, a first cap layer 734, a second inter-layer dielectric layer 736, a second cap layer 738 a third cap layer 740 and a third inter-layer dielectric layer 742.

A trench is formed in the second cap layer 738 and the second inter-layer dielectric layer 736 to receive the bottom electrode 606, the MTJ stack 608, and the top electrode 610. The trench has a trench depth (d) and the MTJ stack 608 has a depth (c) that is approximately equal to the trench depth (d) minus a thickness of the bottom electrode 606. A bottom via 744 extends from a bottom surface 790 through the first cap layer 734 and the first inter-layer dielectric layer 732 and is coupled to the bottom electrode 606. The via 612 extends from a top surface 780 of the substrate 602 through the third inter-layer dielectric layer 742 and the third cap layer 740 and is coupled to the top electrode 610. The top surface 780 may be a substantially planar surface.

In a particular embodiment, the trench depth (d) is greater than the MTJ cell depth (c), which are both greater than the length (a) of the MTJ cell 604. In this particular example, the magnetic domains 622 and 624 are oriented vertically (i.e., in a direction of the depth (d) of the sidewalk, as opposed to horizontally in a direction of the length (a) of the sidewalls).

Figure 8:
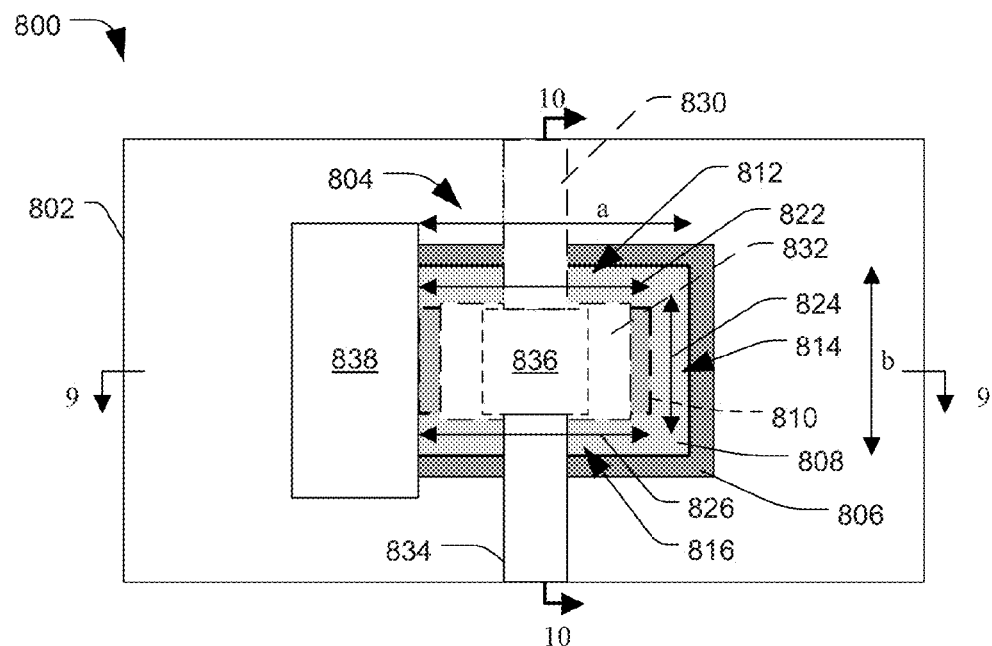
FIG. 8 is a top view of a particular illustrative embodiment of a memory device including a substrate having a magnetic tunnel junction cell that is adapted to store multiple bits.

FIG. 8 is a top view of a particular illustrative embodiment of a memory device 800 including a substrate 802 with having a magnetic tunnel junction (MTJ) cell 804 that is adapted to store multiple data bits. The magnetic tunnel junction (MTJ) cell 804 includes a bottom electrode 806, an MTJ stack 808, and a center electrode 810. The MTJ cell 804 has a length (a) and a width (b), where the length (a) is greater than the width (b). The substrate 802 includes a top via 836 that is coupled to the center electrode 810 and includes a bottom via 832 that is coupled to the bottom electrode 806. The substrate 802 also includes a first wire trace 834 that is coupled to the top via 836 and a second wire trace 830 that is coupled to the bottom via 832. The substrate 802 includes a process opening 838.

The MTJ stack 808 includes a fixed (pinned) magnetic layer that carries a fixed magnetic domain having a fixed orientation, a tunnel barrier layer, and a free magnetic layer having a magnetic domain that can be changed or programmed via a write current. The MTJ stack 808 may also include an anti-ferromagnetic layer to pin the fixed magnetic layer. In a particular embodiment, the fixed magnetic layer of the MTJ stack 808 may include one or more layers. Additionally, the MTJ stack 808 may include other layers. The MTJ cell 804 includes a first sidewall 812 to carry a first magnetic domain 822, a second sidewall 814 to carry a second magnetic domain 824, and a third sidewall 816 to carry a third magnetic domain $26. The MTJ cell 804 also includes bottom wall 970 to carry fourth magnetic domain 972 (see FIG. 9). The first, second, third, and fourth magnetic domains 822, 824, 826, and 972 are independent. In a particular embodiment, the first, second, third, and fourth magnetic domains 822, 824, 826, and 972 are configured to represent respective data values. In general, the orientations of the magnetic domains 822, 824, 826, and 972 are determined by the stored data value. For example, a "0" value is represented by a first orientation while a "1" value is represented by a second orientation.

Figure 9:
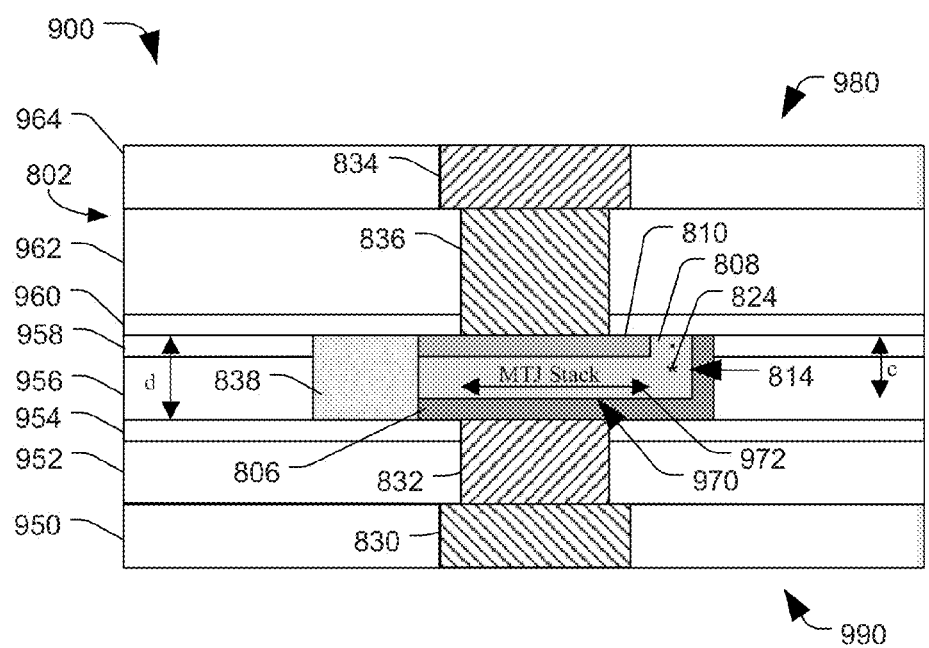
FIG. 9 is a cross-sectional diagram of the circuit device of FIG. 8 taken along line 9-9 in FIG. 8.

FIG. 9 is a cross-sectional diagram 900 of the circuit device 800 of FIG. $ taken along line 9-9 in FIG. 8. The diagram 900 includes the substrate 802 having a first inter-layer dielectric layer 950, a second inter-layer dielectric layer 952, a first cap layer 954, a third inter-layer dielectric layer 956, a second cap layer 958, a third cap layer 960, a fourth inter-layer dielectric layer 962, and a fifth inter-layer dielectric layer 964. The substrate 802 has a first surface 980 and a second surface 990. The substrate 802 also includes the MTJ structure 804 including the MTJ stack 808. The bottom electrode 806, the MTJ stack 808, and the top electrode 810 are disposed within a trench in the substrate 802. The trench has a depth (d).

The substrate 802 includes the second wire trace 830 disposed at the second surface 990. The second wire trace 830 is coupled to the bottom via 832, which extends from the second wire trace 830 to a portion of the bottom electrode 806. The substrate 802 also includes the first wire trace 834 disposed at the first surface 980. The first wire trace 834 is coupled to the top via 836, which extends from the first wire trace 834 to the center electrode 810. The center electrode 810 is coupled to the MTJ stack 808. The substrate 802 also includes the process opening 838, which may be formed by selectively removing a portion of the MTJ structure 804 and depositing an inter-layer dielectric material within the processing opening 838, followed by an oxide CMP.

In a particular embodiment, the MTJ stack 808 includes the second sidewall 814, which carries the second magnetic domain 824. The second magnetic domain 824 is adapted to represent a second data value. The MTJ stack 808 also includes a bottom wall 970 having a bottom magnetic domain 972, which is adapted to represent a fourth data value. In a particular example, a data value can be read from the MTJ stack 808 by applying a voltage to the first wire trace 834 and by comparing a current at the second wire trace 830 to a reference current. Alternatively, a data value may be written to the MTJ stack 808 by applying a write current to one of the first and second wire traces 834 and 830. In a particular embodiment, the length (a) and the width (b) of the MTJ stack 808 illustrated in FIG. 8 are greater than the trench depth (d), and the magnetic domain 824 carried by the second sidewall 814 extends in a direction that is substantially parallel to the first surface 980 of the substrate 802 and in a direction of the width (b) illustrated in FIG. 8. In this particular view, the magnetic domain 824 extends in a direction that is normal to the page view of FIG. 9 (outward from the page as indicated by an arrow head ("●") or into the page as indicated by a tail of an arrow ("*")).

Figure 10:
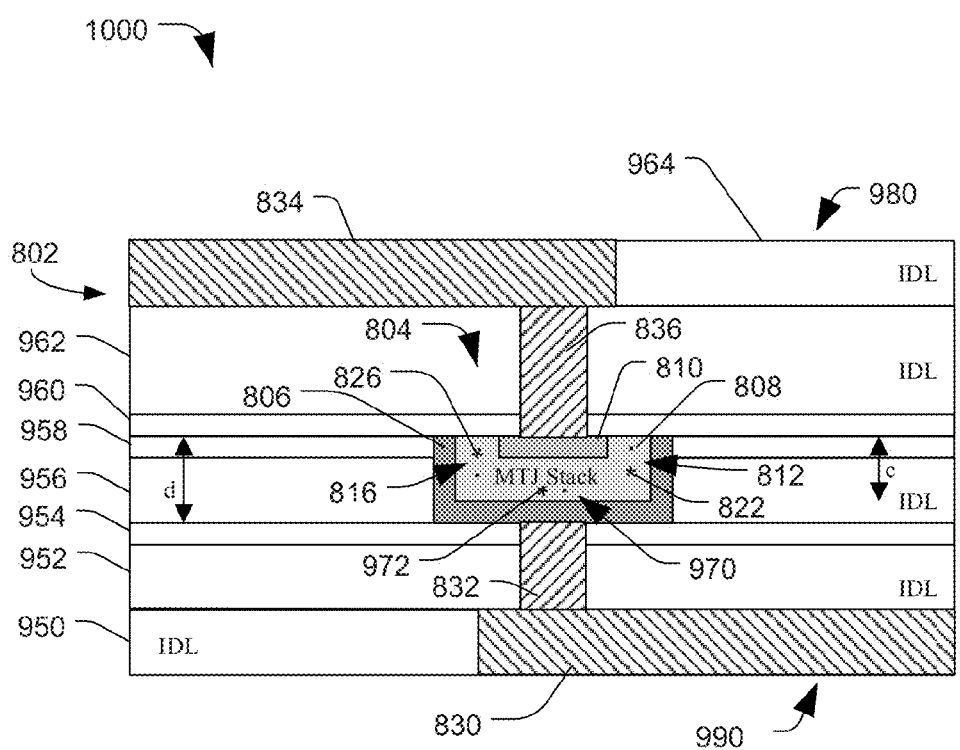
FIG. 10 is a cross-sectional diagram of the circuit device of FIG. 8 taken along line 10-10 in FIG. 8.

FIG. 10 is a cross-sectional diagram 1000 of the circuit device 800 of FIG. 8 taken along line 10-10 in FIG. 8. The diagram 1000 includes the substrate 802 having a first inter-layer dielectric layer 950, a second inter-layer dielectric layer 952, a first cap layer 954, a third inter-layer dielectric layer 956, a second cap layer 958, a third cap layer 960, a fourth inter-layer dielectric layer 962, and a fifth inter-layer dielectric layer 964. The substrate 802 has a first surface 980 and a second surface 990. The substrate 802 includes the MTJ structure 804 having the bottom electrode 806, the MTJ stack 808, and the center electrode 810. The substrate 802 includes the first wire trace 834 disposed and patterned at the first surface 980. The first wire trace 834 is coupled to the top via 836, which extends from the first wire trace 834 to the center electrode 810. The substrate 802 also includes the second wire trace 830 at the second surface 990. The second wire trace 830 is coupled to the bottom via 832, which extends from the second wire trace 830 to a portion of the bottom electrode 806. The MTJ stack 808 includes the first sidewall 816 to carry the first magnetic domain 826, the third sidewall 812 to carry the third magnetic domain 822, and the bottom wall 970 to carry the bottom magnetic domain 972. In this particular view, the magnetic domains 826, 822, and 972 extend in a direction that is normal to the page view of FIG. 10 (outward from the page as indicated by an arrow head ("●") or in o the page as indicated by a tail of an arrow ("*")).

In a particular embodiment, the MTJ stack 808 is adapted to store up to four unique data values. A first data value may be represented by the first magnetic domain 822, a second data value may be represented by the second magnetic domain 824, a third data value may be represented by the third magnetic domain 826, and a fourth data value may be represented by the bottom magnetic domain 972. In another particular embodiment, a fourth sidewall may be included to carry a fourth magnetic domain, which may represent a fifth data value.

Figure 11:
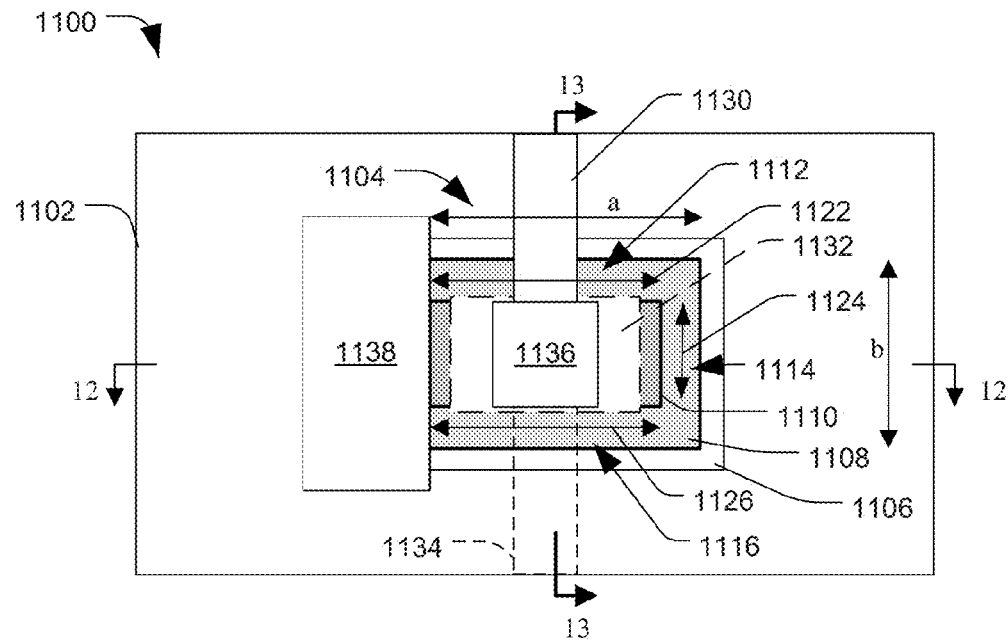
FIG. 11 is a top view of another particular illustrative embodiment of a memory device including a substrate having a magnetic tunnel junction cell that is adapted to store multiple bits.

FIG. 11 is a top view of a particular illustrative embodiment of a memory device 1100 including a substrate 1102 with a magnetic tunnel junction (MTJ) cell 1104 in a deep trench that is adapted to store multiple data values, such as multiple bits. The magnetic tunnel junction (MTJ) cell 1104 includes a bottom electrode 1106, an MTJ stack 1108, and a center electrode 1110. The MTJ cell 1104 has a length (a) and a width (b), where the length (a) is greater than the width (b). The substrate 1102 includes atop via 1136 that is coupled to the center electrode 1110 and includes a bottom via 1132 that is coupled to the bottom electrode 1106. The substrate 1102 also includes a first wire trace 1134 that is coupled to the bottom via 1132 and a second wire trace 1130 that is coupled to the top via 1136. The substrate 1102 includes a process opening 1138.

The MTJ stack 1108 includes a fixed (pinned) magnetic layer that may be pinned by an anti-ferromagnetic layer and that carries a fixed magnetic domain having a fixed orientation, a tunnel barrier layer, and a free magnetic layer having a magnetic domain that can be changed or programmed via a write current. In a particular embodiment, the fixed magnetic layer of the MTJ stack 1108 may include one or more layers. Additionally, the MTJ stack 1108 may include other layers. The MTJ cell 1104 includes a first sidewall 1112 to carry a first magnetic domain 1122, a second sidewall 1114 to carry a second magnetic domain 1124, and a third sidewall 1116 to carry a third magnetic 1126. The MU cell 1104 may also include a bottom wall 1270 to carry a fourth magnetic domain 1272 (see FIG. 12). The first, second, third, and fourth magnetic domains 1122, 1124, 1126, and 1272 are independent. In a particular embodiment, the first, second, third, and fourth magnetic domains 1122, 1124, 1126, and 1272 are configured to represent respective data values. In general, the orientations of the magnetic domains 1122, 1124, 1126, and 1272 are determined by the stored data value. For example, a "0" value is represented by a first orientation while a "1" value is represented by a second orientation.

Figure 12:
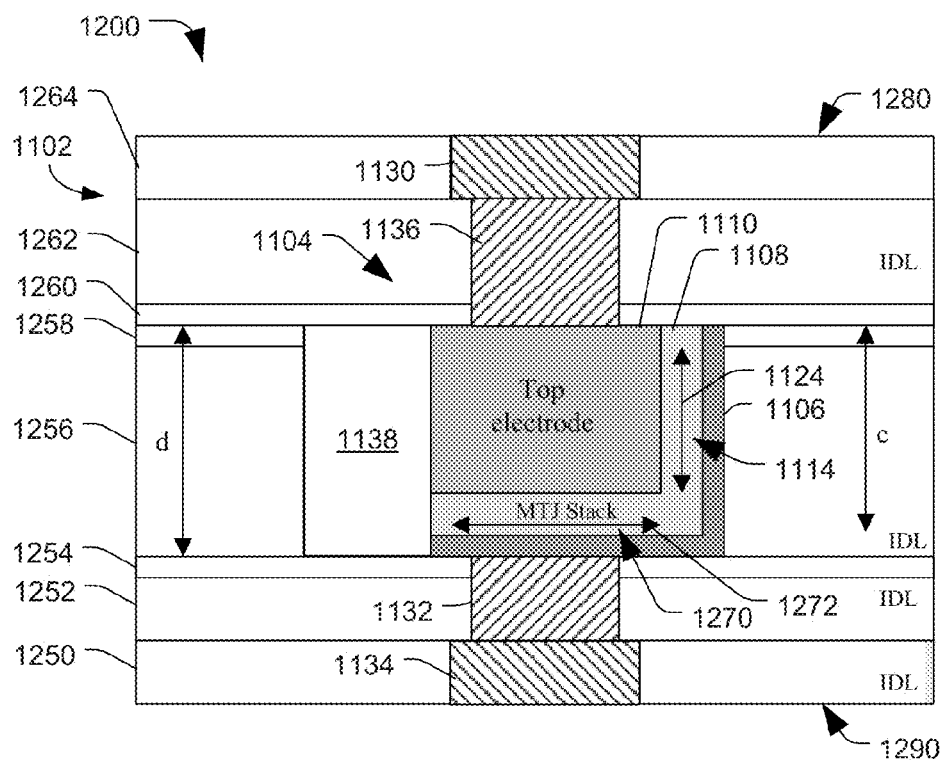
FIG. 12 is a cross-sectional diagram of the circuit device of FIG. 11 taken along line 12-12 in FIG. 11.

FIG. 12 is a cross-section 1 diagram 1200 of the circuit device 1100 of FIG. 11 taken along line 12-12 in FIG. 11. The diagram 1200 includes the substrate 1102 having a first inter-layer dielectric layer 1250, a second inter-layer dielectric layer 1252, a first cap layer 1254, a third inter-layer dielectric layer 1256, a second cap layer 1258, a third cap layer 1260, a fourth inter-layer dielectric layer 1262, and a fifth inter-layer dielectric layer 1264. The substrate 1102 has a first surface 1280 and a second surface 1290. The substrate 1102 also includes the MTJ structure 1104 including the MTJ stack 1108. The bottom electrode 1106, the MTJ stack 1108, and the top electrode 1110 are disposed within a trench in the substrate 1102. The trench has a depth (d). In this instance, the depth (d) is greater than the width (b) of the sidewall 1114.

The substrate 1102 includes the second wire trace 1130 disposed and patterned at the first surface 1280. The second wire trace 1130 is coupled to the top via 1136, which extends from the second wire trace 1130 to the center electrode 1110. The center electrode 1110 is coupled to the MTJ stack 1108. The substrate 1102 also includes the first wire trace 1134 disposed at the second surface 1290. The first wire trace 1134 is coupled to the bottom via 1132, which extends from the first wire trace 1134 to a portion of the bottom electrode 1106. The substrate 1102 further includes the process opening 1138, which may be formed by selectively removing a portion of the MTJ stack 1108 and by depositing an inter-layer dielectric material within the processing opening 1138, followed by an oxide CMP process.

In a particular embodiment, the MTJ stack 1108 includes the second sidewall 1114, which carries the second magnetic domain 1124. The second magnetic domain 1124 is adapted to represent a second data value. The MTJ stack 1108 also includes a bottom wall 1270 having a bottom magnetic domain 1272, which is adapted to represent a fourth data value. In a particular example, a data value can be read from the MTJ stack 1108 by applying a voltage to the second wire trace 1130 and by comparing a current at the first wire trace 1134 to a reference current. Alternatively, a data value may be written to the MTJ stack 1108 by applying a write current between the first and second wire traces 1134 and 1130. In a particular embodiment, the length (a) and the width (b) of the MTJ stack 1108 illustrated in FIG. 11 are less than the trench depth (d), and the magnetic domain 1124 carried by the second sidewall 1114 extends in a direction that is substantially perpendicular to the first surface 1280 of the substrate 1102 and in a direction of the depth (d).

Figure 13:
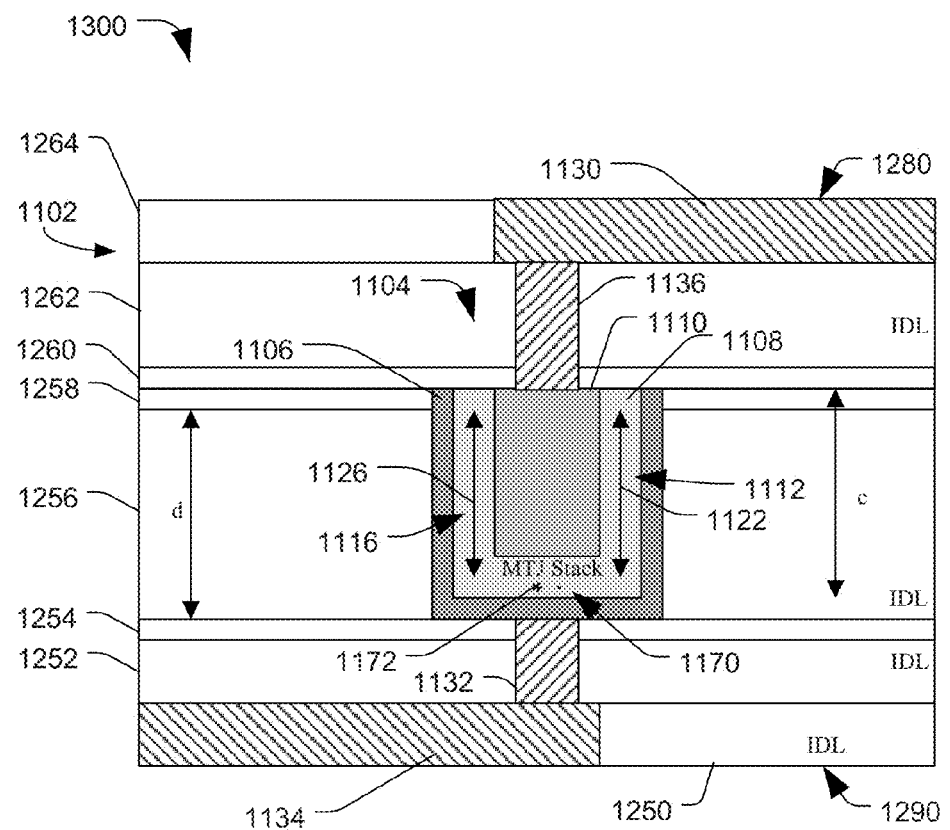
FIG. 13 is a cross-sectional diagram of the circuit device of FIG. 11 taken along line 13-13 in FIG. 11.

FIG. 13 is a cross-sectional diagram 1300 of the circuit device 1100 of FIG. 11 taken along line 13-13 in FIG. 11. The diagram 1300 includes the substrate 1102 having a first inter-layer dielectric layer 1250, a second inter-layer dielectric layer 1252, a first cap layer 1254, a third inter-layer dielectric layer 1256, a second cap layer 1258, a third cap layer 1260, a fourth inter-layer dielectric layer 1262, and a fifth inter-layer dielectric layer 1264. The substrate 1102 has a first surface 1280 and a second surface 1290. The substrate 1102 includes the MTJ structure 1104 having the bottom electrode 1106, the MTJ stack 1108, and the center electrode 1110. The substrate 1102 includes the first wire trace 1134 disposed and patterned at the second surface 1290. The first wire trace 1134 is coupled to the bottom via 1132, which extends from the first wire trace 1134 to a portion of the bottom electrode 1106. The substrate 1102 also includes the second wire trace 1130 at the first surface 1280. The second wire trace 1130 is coupled to the top via 1136, which extends from the second wire trace 1130 to the center electrode 1110.

The MTJ stack 1108 includes the first sidewall 1116 to carry the first magnetic domain 1126, the third sidewall 1112 to carry the third magnetic domain 1122, and the bottom wall 1270 to carry the bottom magnetic domain 1272. In this particular view, the trench depth (d) is greater than the length (a) and the width (b) of the MTJ stack 1108, and the first and third magnetic domains 1122 and 1126 extend in a direction that is substantially perpendicular to the first surface 1280. The length (a) is greater than the width (b) of the MTJ stack 1108, and the fourth magnetic domain 1172 extends in a direction that is substantially normal to the page view (outward from the page as indicated by an arrow head ("●") or into the page as indicated by a tail of an arrow ("*")).

In a particular embodiment, the MTJ stack 1108 is adapted to store up to four unique data values. A first data value may be represented by the first magnetic domain 1122, a second data value may be represented by the second magnetic domain 1124, a third data value may be represented by the third magnetic domain 1126, and a fourth data value may be represented by the bottom magnetic domain 1272. In another particular embodiment, a fourth sidewall may be included to carry a fourth magnetic domain, which may represent a fifth data value.

Figure 14:
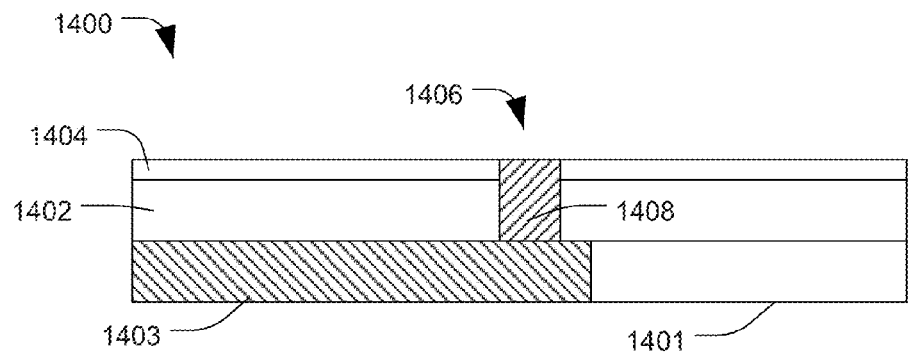
FIG. 14 is a cross-sectional view of circuit substrate after deposition of a cap film layer and after via photo/etching, photo-resist strip, via fill, and via Chemical-Mechanical Planarization (CMP) processes.

FIG. 14 is a cross-sectional view of a circuit substrate 1400 after deposition of a cap film layer and after via photo-etching, photo-resist strip, via fill, and via Chemical-Mechanical Planarization (CMP) processes. The circuit substrate 1400 includes a first inter-layer dielectric layer 1401, and a wire trace 1403, a second inter-layer dielectric layer 1402 disposed on top of the first inter-layer dielectric layer 1401, and a cap film layer 1404 disposed on top of the inter-layer dielectric layer 1402. In a particular embodiment, a photo-resistive layer was applied by spinning photo-resist onto the cap film layer 1404. A photo-etching process was applied to define a pattern in the cap layer 1404 and the inter-layer dielectric 1402 by the photo-resistive layer. The photo-resistive layer was stripped after etching to expose an opening or via 1406 through the cap film layer 1404 and the inter-layer dielectric layer 1402. A conductive material or via fill material 1408 was deposited into the opening 1406, and a via. CMP process was performed to planarize the circuit substrate 1400.

Figure 15:
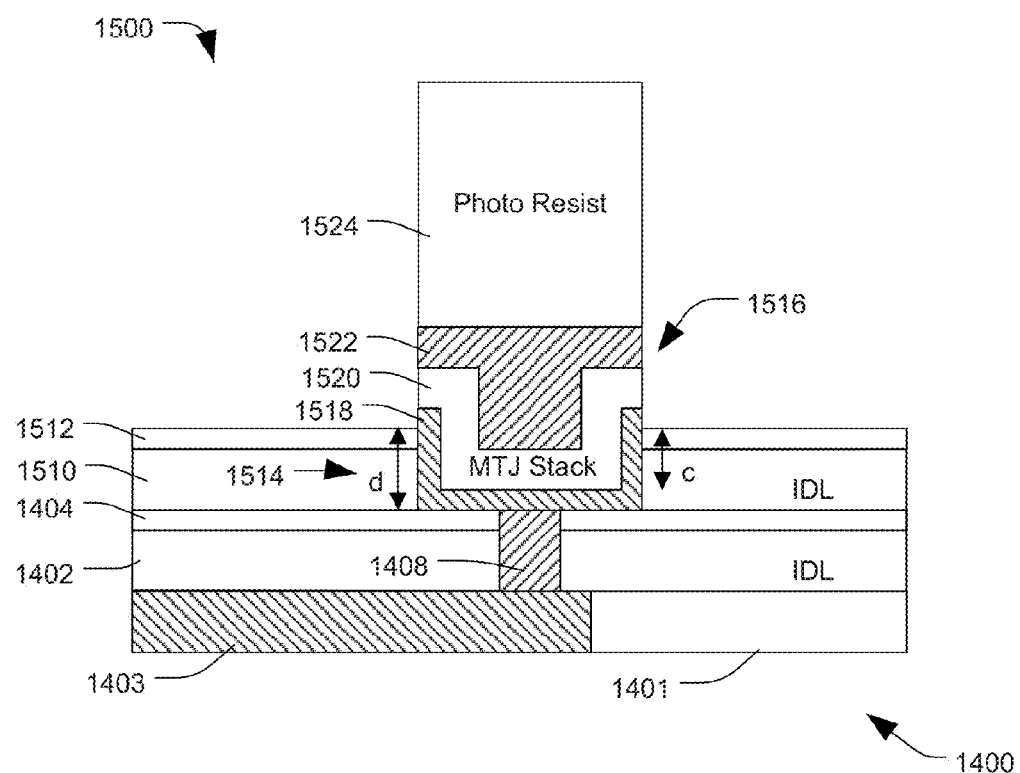
FIG. 15 is a cross-sectional view of the circuit substrate of FIG. 14 after inter-layer dielectric layer deposition, cap film deposition, trench photo/etch process, bottom electrode deposit, magnetic tunnel junction (MTJ) films deposition, top electrode deposit, and reverse photo/etch processing.

FIG. 15 is a cross-sectional view 1500 of the circuit substrate 1400 of FIG. 14 after inter-layer dielectric layer deposition, cap film deposition, trench photo-etch process, trench photo resist strip, bottom electrode deposit, magnetic tunnel junction (MTJ) films deposit, top electrode deposit, and reverse photo-etch processing. The circuit substrate 1400 includes the first inter-layer dielectric layer 1401, and a wire trace 1403, the second inter-layer dielectric layer 1402, the cap film layer 1404, and the via fill material 1408. A third inter-layer dielectric layer 1510 is deposited onto the cap film layer 1404. A second cap film layer 1512 is deposited onto the third inter-layer dielectric layer 1510. A trench 1514 is defined within the cap film layer 1512 and the third inter-layer dielectric layer 1510, for example by performing a trench photo-etch and cleaning process. A magnetic tunnel junction (MTJ) cell 1516 is deposited within the trench 1514. The MTJ cell 1516 includes a bottom electrode 1518 that is coupled to the bottom via fill material 1408, an MTJ stack 1520 coupled to the bottom electrode 1518, and a top electrode 1522 coupled to the MTJ stack 1520. A photo-resist layer 1524 is patterned on the top electrode 1522. A reverse photo-etching process is applied to the photo resist layer 1524, the top electrode 1522, the MTJ stack 1520, and the bottom electrode 1518 to remove excess material that is not within the trench 1514.

In this particular example, the trench 1514 is defined to have a trench depth (d). The thickness of the bottom electrode 1518 defined a relative MTJ cell depth (c). In a particular example, the MTJ cell depth (c) is approximately equal to the trench depth (d) minus the thickness of the bottom electrode 1518.

In general, by fabricating the MTJ cell 1516 within the trench 1514, the dimensions of the trench 1514 define the dimensions of the MTJ cell 1516. Further, since the trench 1514 defines the dimensions of the MTJ cell 1516, the MTJ cell 1516 can be formed without performing a critical and expensive photo-etch process on the MTJ cell 1516, thereby reducing oxidation, corner rounding and other erosion-related issues with respect to the MTJ cell 1516.

Figure 16:
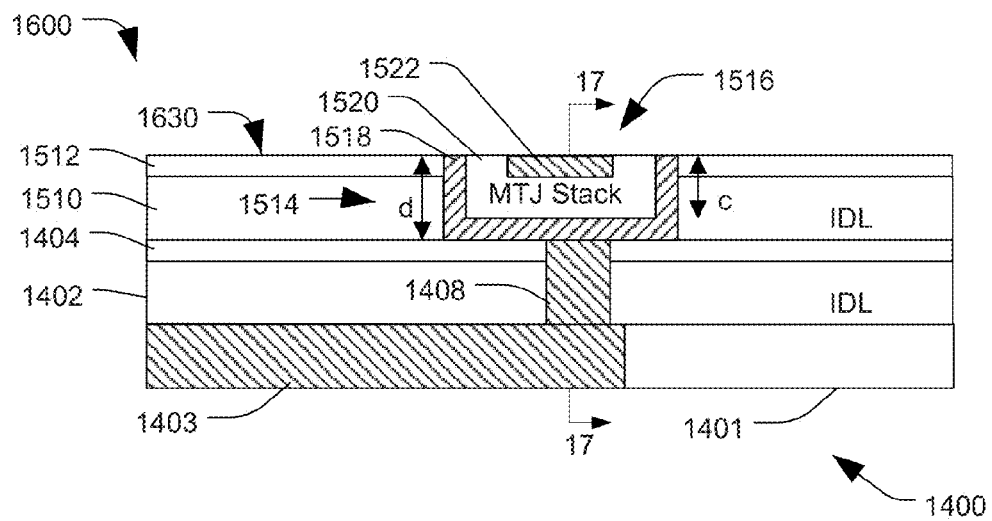
FIG. 16 is a cross-sectional view of the circuit substrate of FIG. 15 after reverse photo-resist strip and MTJ CMP processing to stop at the cap film layer.

FIG. 16 is a cross-sectional view 1600 of the circuit substrate 1400 of FIG. 15 after reverse photo resist strip and MTJ CMP processing to stop at the cap film layer. The circuit substrate 1400 includes the first inter-layer dielectric layer 1401, the wire trace 1403, the second inter-layer dielectric layer 1402, and the first cap layer 1404. The view 1600 includes the second inter-layer dielectric layer 1510, the second cap layer 1512 and the MTJ structure 1516. The MTJ structure 1516 has an MTJ cell depth (d) and is formed within a trench 1514 having a trench depth (d). The MTJ structure 1516 includes a bottom electrode 1518 that is coupled to a via fill material 1408, an MTJ stack 1520, and a top electrode 1522. A photo resist strip process is applied, and an MTJ Chemical-Mechanical Planarization (CMP) process is applied to remove portions of the MTJ structure 1516 to produce a substantially planar surface 1630. The CMP process is stopped at the second cap film layer 1512.

Figure 17:
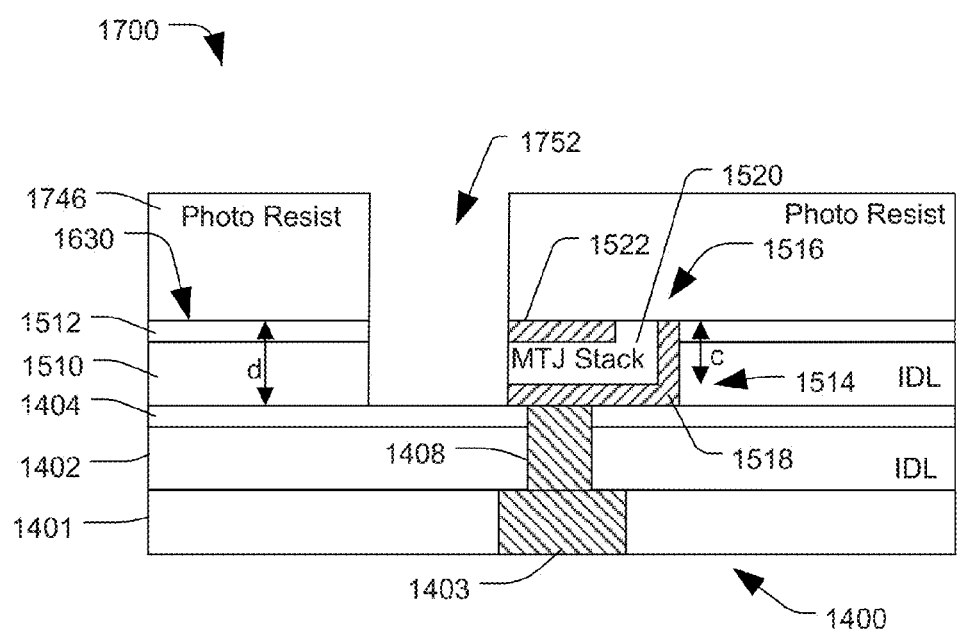
FIG. 17 is a cross-sectional view of the circuit substrate of FIG. 16 taken along line 17-17 in FIG. 16 after spinning on photo resist and after photo-etching to remove a sidewall of the MTJ stack providing a process opening.

FIG. 17 is a cross-sectional view 1700 of the circuit substrate 1400 of FIG. 16 taken along line 17-17 in FIG. 16, after photo resist is spun on and patterned, and an MTJ sidewall etch is performed. The circuit substrate 1400 includes the first inter-layer dielectric layer 1401, the wire trace 1403, the second inter-layer dielectric layer 1402, the first cap film layer 1404, and a via fill material 1408. The third inter-layer dielectric layer 1510 and the second cap layer 1512 are deposited on the second cap layer 1404. A trench 1514 is defined in the second cap layer 1512 and the second inter-layer dielectric layer 1510. The bottom electrode 1518, the MTJ stack 1520, and the top electrode 1522 are formed within the trench 1514. A Chemical-Mechanical Planarization (CMP) process is applied to produce a substantially planar surface 1630. A photo resist layer is spun on and a process pattern opening 1752 is defined using a photo-etch process. The photo-etch process removes a sidewall from the MTJ cell 1516, resulting in a substantially u-shaped MTJ cell 1516 (from a top view).

Figure 18:
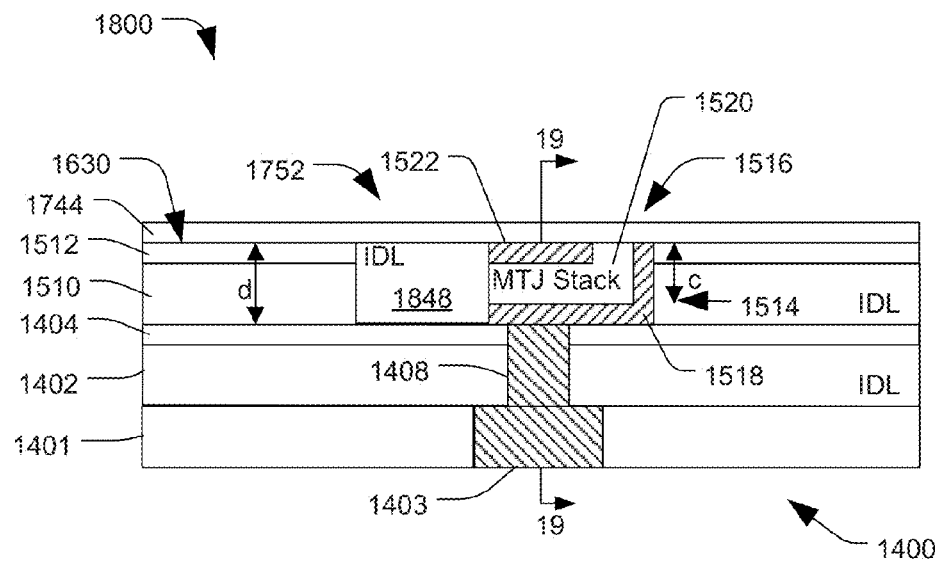
FIG. 18 is a cross-sectional view of the circuit substrate of FIG. 17 after filling the process opening with IDL material and oxide and a CMP process stop at the cap layer.

FIG. 18 is a cross-sectional view 1800 of the circuit substrate 1400 illustrated in FIG. 17 after deposition of inter-layer dielectric material within the process opening 1752, after performing a chemical-mechanical planarization (CMP) process, and after depositing a third capping layer 1744. The circuit substrate 1400 includes the first inter-layer dielectric layer 1401, the wire trace 1403, the second inter-layer dielectric layer 1402, the first cap film layer 1404, and a via fill material 1408. The third inter-layer dielectric layer 1510 and the second cap layer 1512 are deposited on the first cap film layer 1404. A trench 1514 is defined in the second cap layer 1512 and the second inter-layer dielectric layer 1510. The bottom electrode 1518, the MTJ stack 1520, and the top electrode 1522 are formed within the trench 1514. A Chemical-Mechanical Planarization (CMP) process is applied to restore the substantially planar surface 1630. A process opening 1752 is defined using a photo-etch process. The photo-etch process removes sidewall from the MTJ cell 1516, resulting in a substantially u-shaped MTJ cell 1516 (from a top view). The process opening 1752 is filled with an inter-layer dielectric material 1848, a CMP process is performed to restore the substantially planar surface 1630, and the third cap layer 1744 is deposited on the substantially planar surface 1630.

Figure 19:
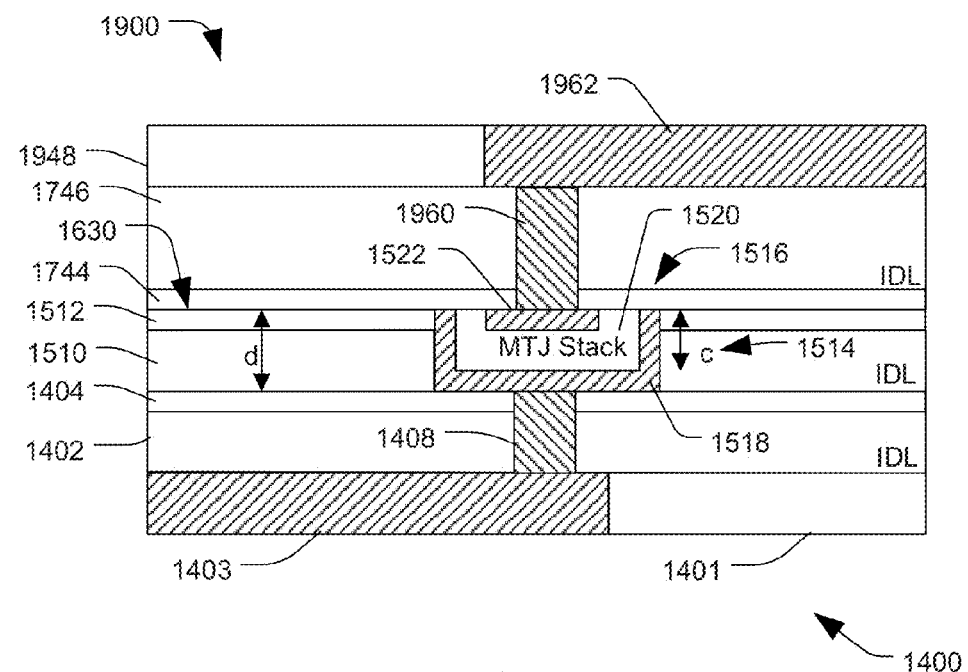
FIG. 19 is a cross-sectional view of the circuit substrate of FIG. 18 taken along the line 19-19 in FIG. 18 after deposition of a first IDL layer, via processing, and metal film deposition and patterning of a top wire trace.

FIG. 19 is a cross-sectional view 1900 of the circuit substrate 1400, which may be coupled to other circuitry. The circuit substrate 1400 includes the first inter-layer dielectric layer 1401, the wire trace 1403, the second inter-layer dielectric layer 1402, the first cap film layer 1404, and a via fill material 1408. The third inter-layer dielectric layer 1510 and the second cap layer 1512 are deposited on the first cap film layer 1404. A trench 1514 is defined in the second cap layer 1512 and the second inter-layer dielectric layer 1510. The bottom electrode 151$, the MTJ stack 1520, and the top electrode 1522 are formed within the trench 1514. A Chemical-Mechanical Planarization (CMP) process is applied to restore the substantially planar surface 1630. A third cap layer 1744 and a fourth inter-layer dielectric layer 1746 are deposited. A photo-etch process is applied to define a via 1960 through the fourth inter-layer dielectric layer 1746 and the third cap layer 1744. The via 1960 is filled with conductive material and a via chemical-mechanical planarization process is applied. A metal wire trace 1962 is deposited and patterned on the fourth inter-layer dielectric layer 1746 and a fifth inter-layer dielectric layer 1948 is deposited. If a Damascene process is used, the via and metal wire can be combined into trench patterning, copper plating, and copper CMP in the fifth inter-layer dielectric layer 1948 and the fourth inter-layer dielectric layer 1746. In a particular embodiment, another chemical-mechanical planarization process may be performed to planarize the circuit device. At this stage, the wire trace 1403 and the wire trace 1962 may be coupled to other circuitry, and the MTJ cell 1516 may be used to store one or more data values.

Figure 20:
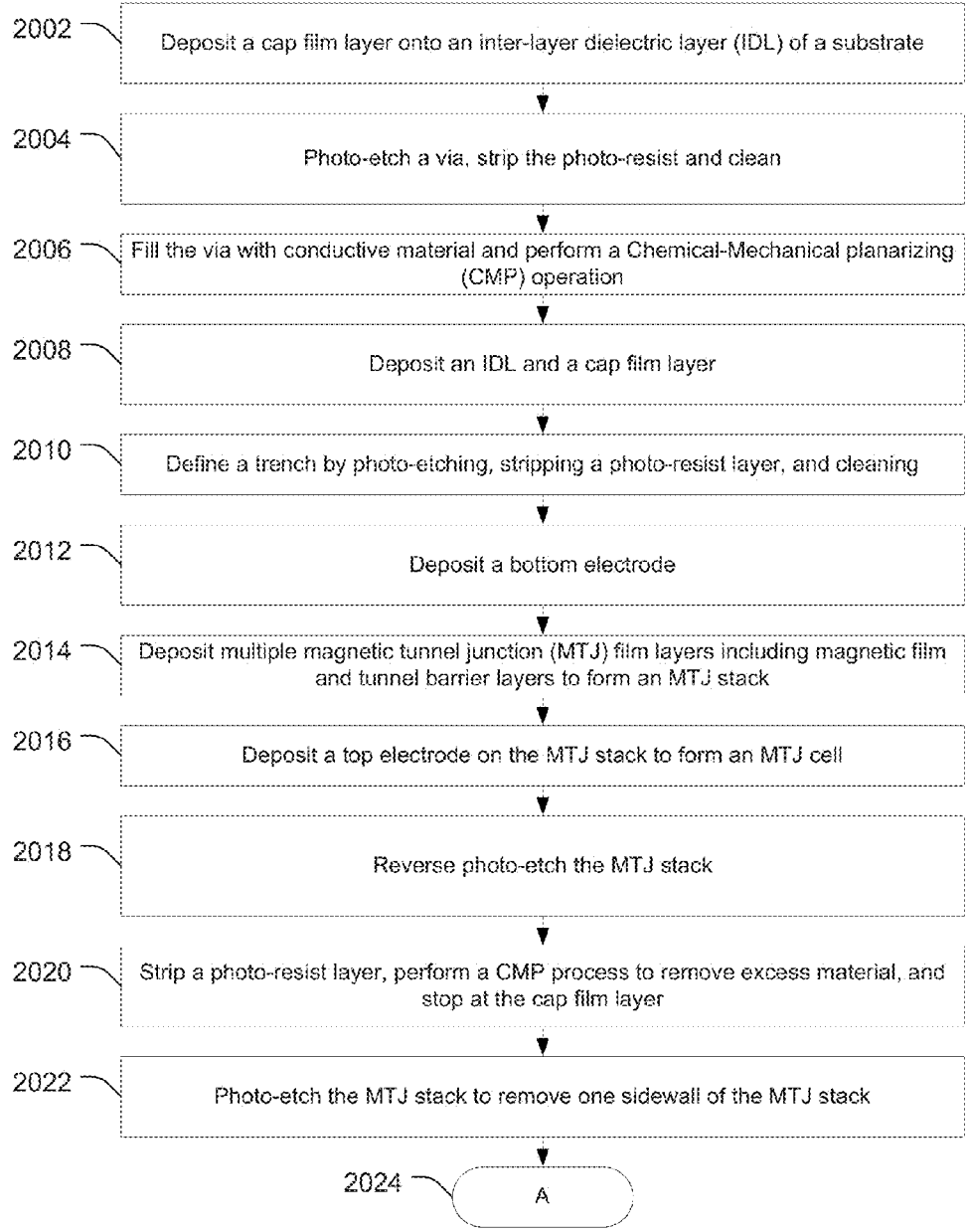
FIGS. 20-21 illustrate a flow diagram of a particular illustrative embodiment of a method of forming a magnetic tunnel junction (MTJ) cell.

FIG. 20 is a flow diagram of a particular illustrative embodiment of a method of forming a magnetic tunnel junction (MTJ) cell. At 2002, a cap film is deposited onto an inter-layer dielectric layer of a substrate. Advancing to 2004, a via is defined using a photo-etch process, a photo-resist strip process, and a cleaning process. Continuing to 2006, the via or opening is filled with conductive material and a via Chemical-Mechanical Planarization (CMP) process is performed on the substrate to remove excess conductive material. Moving to 2008, an inter-layer dielectric layer (IDL) and a cap film layer are deposited. Continuing to 2010, a trench is defined by photo-etching, stripping a photo resist, and cleaning.

Proceeding to 2012, a bottom electrode is deposited. Continuing to 2014, multiple magnetic tunnel junction (MTJ) film layers are deposited, including magnetic film and tunnel barrier layers, to form a magnetic tunnel junction (MTJ) stack. Continuing to 2016, a top electrode is deposited on the MTJ stack to form an MTJ cell. Advancing to 2018, a reverse trench photo-etch process is performed to remove excess material that is not directly over the trench. At 2020, photo-resist is stripped and a MTJ Chemical-Mechanical Planarization (CMP) process is performed to remove excess material, stopping at the cap film layer. Proceeding to 2022, the MTJ stack is photo-etched to remove one sidewall of the MTJ stack. In a particular embodiment, the photo-etching of the MTJ stack defines a process window or opening. The method advances to 2024.

Figure 21:
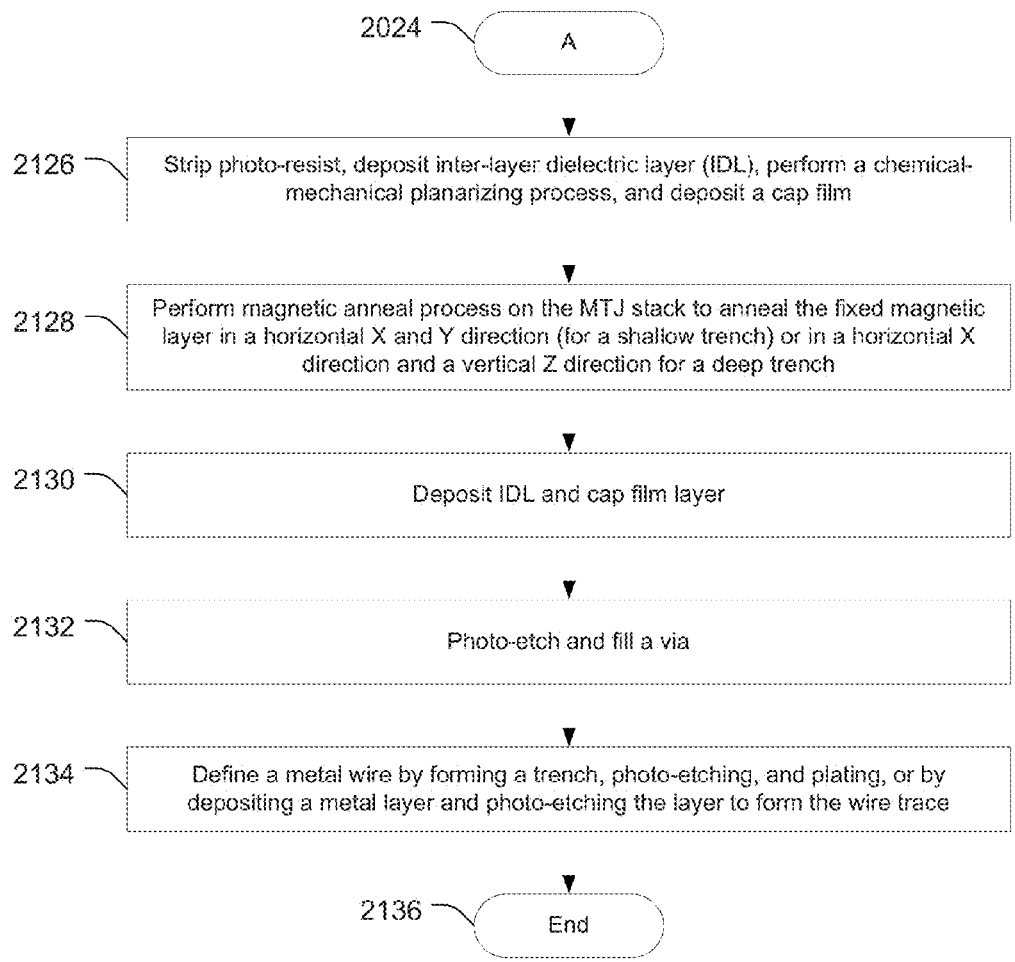

Turning to FIG. 21, at 2024, the method advances to 2126 and a photo resist is stripped, an inter-layer dielectric layer is deposited, an oxide Chemical-Mechanical Planarization (CMP) process is performed, and a cap film layer is deposited. Moving to 2128, a magnetic anneal process is performed on the MTJ stack to anneal the fixed magnetic layer in a horizontal X and Y direction (for a shallow trench) or in a horizontal X-direction and a vertical Z-direction (for a deep trench). Proceeding to 2130, an inter-layer dielectric layer and a cap film layer are deposited. Continuing to 2132, a via is photo-etched and filled and a via Chemical-Mechanical Planarization (CMP) process is performed. Advancing to 2134, a metal wire is defined by depositing a metal layer and photo-etching the layer to form the wire trace or by forming a trench, photo-etching, plating and performing a Chemical-Mechanical Planarization (CMP) process. If a Damascene process is used, the via processing at 2132 and the metal wire processing at 2134 can be combined as trench photo/etch defined, photo resist strip, copper plating, and copper CMP process. The method terminates at 2136.

Figure 22:
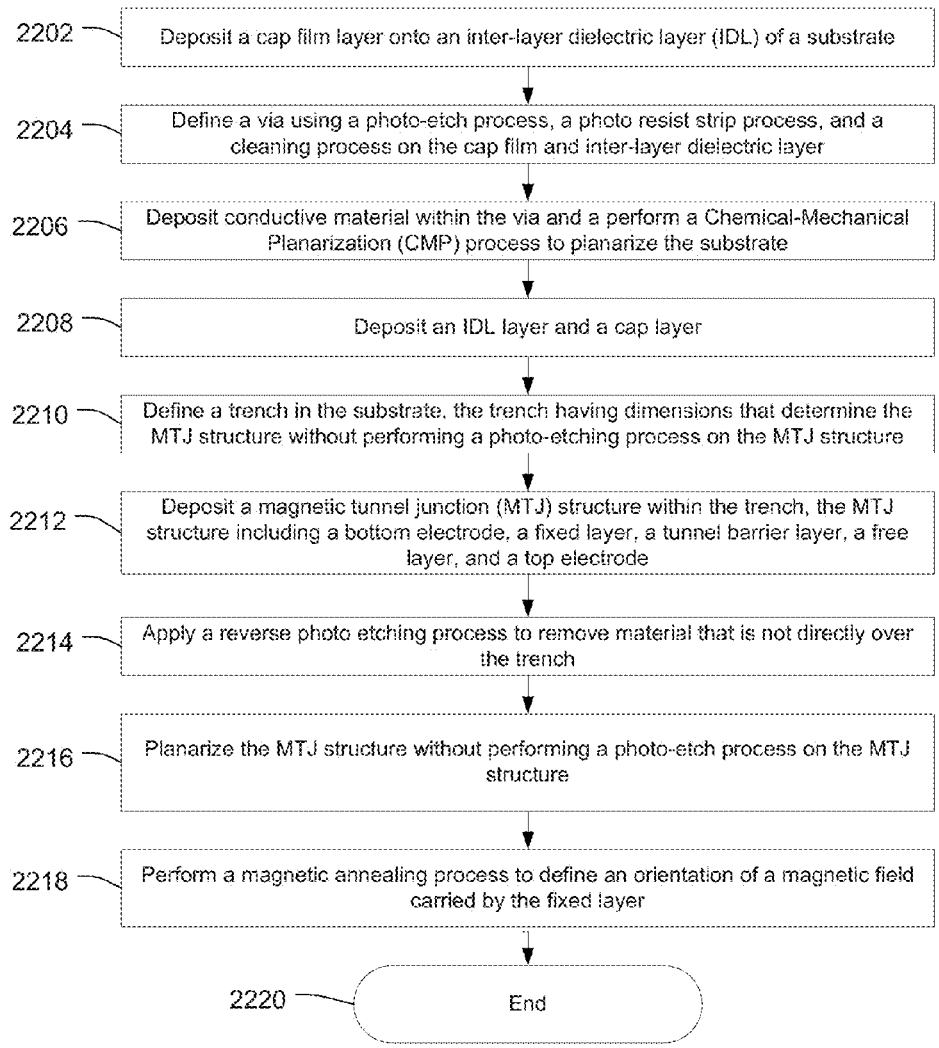
FIG. 22 is a flow diagram of a second particular illustrative embodiment of a method of forming an MTJ cell.

FIG. 22 is a flow diagram of a second particular embodiment of a method of forming a magnetic tunnel junction (MTJ) structure. The method generally includes forming a trench in a substrate, depositing a MTJ structure within the trench, and planarizing the MTJ structure without performing a photo-etch process on the MTJ structure. At 2202, a cap film is deposited onto an inter-layer dielectric layer of a substrate. Advancing to 2204, a via is defined using a photo-etch process, a photo-resist strip process, and a cleaning process on the cap film and inter-layer dielectric layers. Continuing to 2206, conductive material is deposited within the via and a Chemical-Mechanical Planarization (CMP) process is performed to planarize the substrate. Moving to 2208, a ILD film layer and a cap film layer may be deposited. Continuing to 2210, a trench is defined in the substrate. The trench has dimensions that determine the MTJ structure without performing a photo-etching process on the MTJ structure.

Proceeding to 2212, after forming a trench in the substrate, a magnetic tunnel junction (MTJ) structure is deposited within the trench. The MTJ structure includes a bottom electrode, a fixed layer, a tunnel barrier layer, a free layer, and a top electrode. The MTJ structure may also include an anti-ferromagnetic layer between the bottom electrode and the fixed layer. Additional layers may also be applied, e.g., a seed layer, a buffer layer, a spacer layer, or other layers.

Advancing to 2214, a reverse trench photo etching process may be applied to remove material that is not directly over the trench. Moving to 2216, the MTJ structure is planarized without performing a photo-etch process on the MTJ structure. For example, a critical/expensive photo-etch process is not performed on the MTJ structure. Planarizing the MTJ structure may include performing a CMP process to remove excess material. Deposited material may be eliminated from the substrate to define a substantially planar surface.

Continuing to 2218, a magnetic annealing process may be performed to define an orientation of a magnetic field carried by the fixed layer. The magnetic annealing process may be a three-dimensional (3D) annealing process. All MTJ layers may be annealed via the magnetic annealing process, pinning the fixed layer while allowing the free layer to be modifiable via a write current. The method terminates at 2220.

Figure 23:
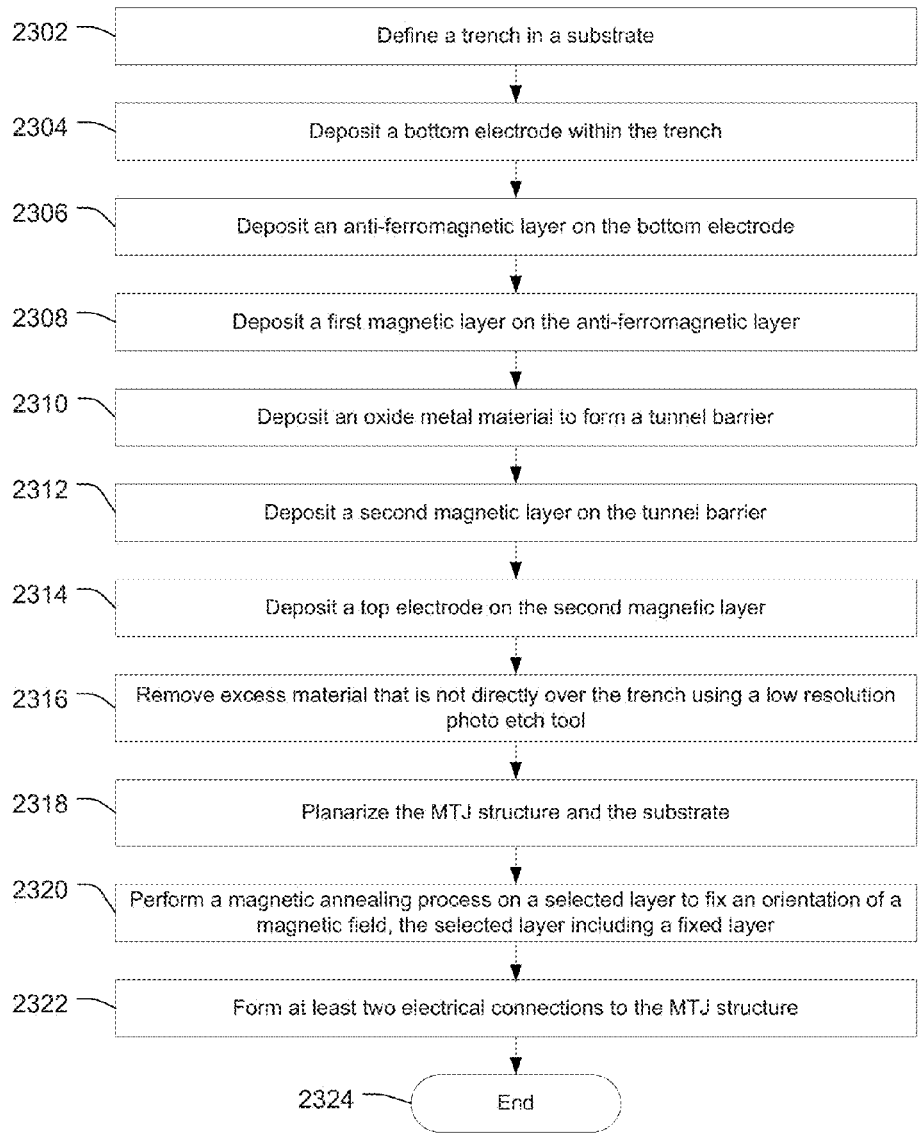
FIG. 23 is a flow diagram of a third particular illustrative embodiment of a method of forming an MTJ cell.

FIG. 23 is a flow diagram of a third particular embodiment of a method of forming a magnetic tunnel junction (MTJ) structure. At 2302, a trench is defined in a substrate. The substrate may include an inter-layer dielectric layer and a cap film layer. Continuing to 2304-2314, a MTJ structure is deposited within the trench. Depositing the MTJ structure may include: depositing a bottom electrode within the trench, at 2304; depositing an anti-ferromagnetic layer on the bottom electrode, at 2306; depositing a first magnetic layer on the anti-ferromagnetic layer, at 2308; depositing an oxide metal material to form a tunnel barrier, such as, for example, MgO or AlO, at 2310; depositing a second magnetic layer on the tunnel barrier, at 2312; and depositing a top electrode on the second magnetic layer, at 2314.

Proceeding to 2316, excess material that is not directly over the trench is removed using a low resolution photo etch process. Advancing to 2318, the MTJ structure and the substrate are planarized. Planarizing the MTJ structure and the substrate may include performing a Chemical-Mechanical Planarization (CMP) process to remove excess material from the MTJ structure and stopping at the cap film layer. A CMP process may be performed without performing a photo-etching process on the MTJ structure. For example, a critical/expensive photo-etch may not be performed on the MTJ structure.

Continuing to 2320, a magnetic annealing process is performed on a selected layer to fix an orientation of a magnetic field, the selected layer including a fixed layer. The magnetic annealing process may be a three-dimensional (3D) annealing process. Multiple MTJ layers may be annealed via the magnetic annealing process, pinning the fixed layer while allowing the free layer to be modifiable via a write current. Moving to 2322, at least two electrical connections to the MTJ structure are formed. The method terminates at 2324.

Figure 24:
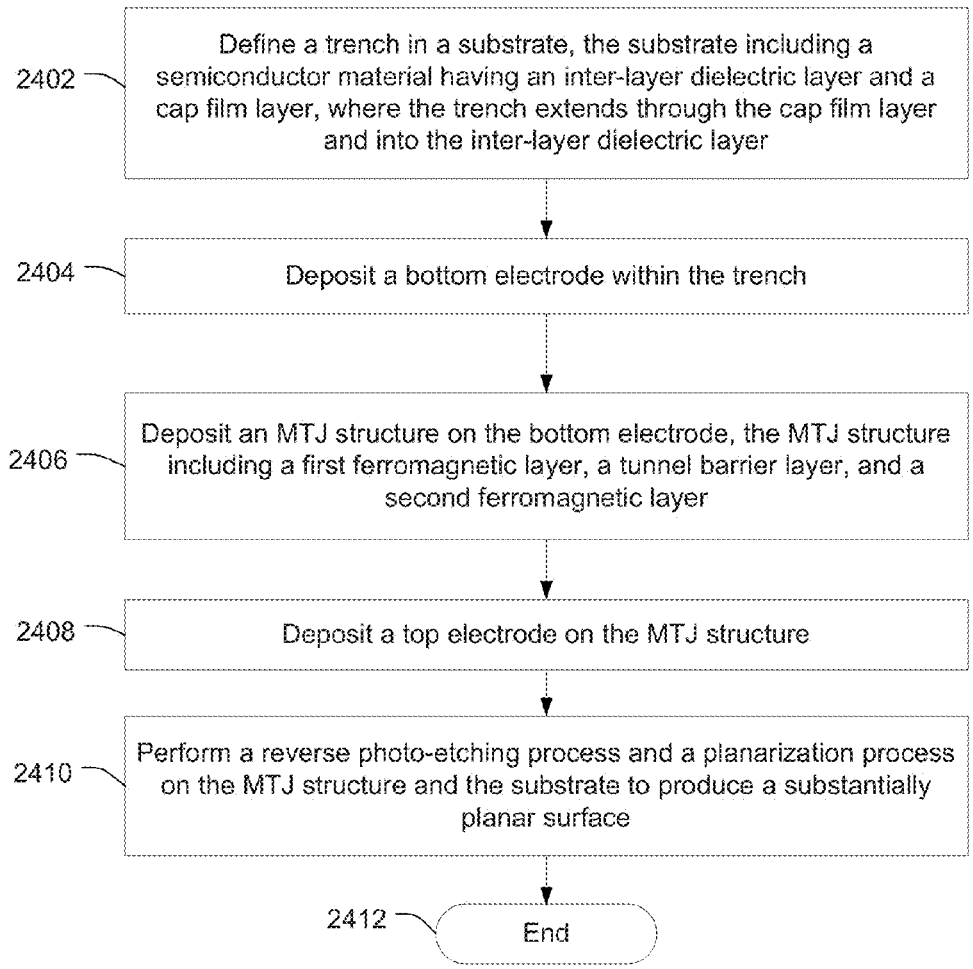
FIG. 24 is a flow diagram of a fourth particular illustrative embodiment of a method of forming an NIT.1 cell.

FIG. 24 is a flow diagram of a fourth particular embodiment of a method of forming a magnetic tunnel junction (MTJ) structure. At 2402, a trench is defined in a substrate, the substrate including a semiconductor material having an inter-layer dielectric layer and a cap film layer, where the trench extends through the cap film layer and into the inter-layer dielectric layer. The trench may define a shape of the MTJ structure. The trench may have a substantially elliptical shape, a substantially rectangular shape, or an alternative shape. Continuing to 2404, a bottom electrode is deposited within the trench. Moving to 2406, an MTJ structure is deposited on the bottom electrode, the MTJ structure including a first ferromagnetic layer, a tunnel barrier layer, and a second ferromagnetic layer. The MTJ structure may also include other layers, such as an anti-ferromagnetic layer between the bottom electrode and the first ferromagnetic layer. Proceeding to 2408, a top electrode is deposited on the MTJ structure.

Continuing to 2410, a reverse trench photo-etching process and a planarization process are performed on the MTJ structure and the substrate to produce a substantially planar surface. Performing the planarization process may include performing a Chemical-Mechanical Planarization (CMP) process on the MTJ structure and the substrate. The MTJ structure may thus be formed without performing a photo-etch process on the MTJ structure that may be critical or expensive. The method term mates at 2412.

Figure 25:
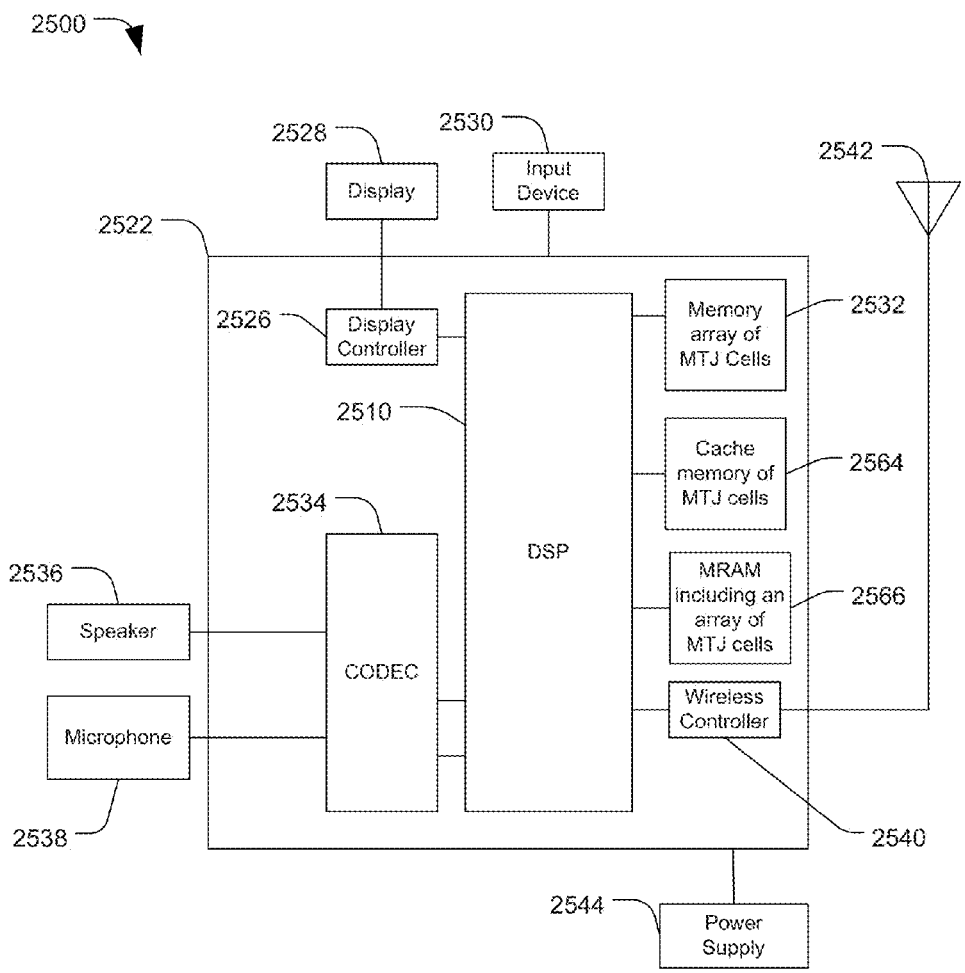
FIG. 25 is a block diagram of a representative wireless communications device including a memory device having a plurality of MTJ cells.

FIG. 25 is a block diagram of a representative wireless communications device 2500 including a memory device having a plurality of MTJ cells. The communications device 2500 includes a memory array of MTJ cells 2532 and a magneto-resistive random access memory (MRAM) including an array of MTJ cells 2566, which are coupled to a processor, such as a digital signal processor (DSP) 2510. The communications device 2500 also includes a cache memory device of MTJ cells 2564 that is coupled to the DSP 2510. The cache memory device of MTJ cells 2564, the memory array of MTJ cells 2532 and the MRAM device including multiple MTJ cells 2566 may include MTJ cells formed according to a process, as described with respect to FIGS. 3-24.

FIG. 25 also shows a display controller 2526 that is coupled to the digital signal processor 2510 and to a display 2528. A coder/decoder (CODEC) 2534 can also be coupled to the digital signal processor 2510. A speaker 2536 and a microphone can be coupled to the CODEC 2534.

FIG. 25 also indicates that a wireless controller 2540 can be coupled to the digital signal processor 2510 and to a wireless antenna 2542. In a particular embodiment, an input device 2530 and a power supply 2544 are coupled to the on-chip system 2522. Moreover, in a particular embodiment, as illustrated in FIG. 25, the display 2528, the input device 2530, the speaker 2536, the microphone 2538, the wireless antenna 2542, and the power supply 2544 are external to the on-chip system 2522. However, each can be coupled to a component of the on-chip system 2522, such as an interface or a controller.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope possible consistent with the principles and novel features as defined by the following claims.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in RAM memory, flash memory, ROM memory, PROM memory, EPROM memory, EEPROM memory, registers, hard disk, a removable disk, a CD-ROM, or any other form of storage medium known in the art. An exemplary storage medium is coupled to the processor such that the processor can read information from, and write information to the storage medium. In the alternative, the storage medium may be integral to the processor. The processor and the storage medium may reside in an ASIC. The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope possible consistent with the principles and novel features as defined by the following claims.

What is claimed is:

1. A magnetic tunnel junction (MTJ) device formed by a process comprising:
    forming a trench in a substrate, that includes an inter-metal dielectric layer and a cap film layer;
    depositing an MTJ structure within the trench, the MTJ structure including a bottom electrode, a pinned layer, a tunnel barrier layer, a free layer, and a top electrode;
    applying a reverse photo etching process to remove material that is not directly over the trench; and
    planarizing the MTJ structure without performing a photo-etch process on the MTJ structure.

2. The MTJ device of claim 1, wherein forming the MTJ device further comprises performing a magnetic annealing process to define an orientation of a magnetic field carried by the pinned layer.

3. The MTJ device of claim 1, wherein the trench has a substantially rectangular shape.

4. The MTJ device of claim 1, wherein planarizing the MTJ structure comprises performing a chemical-mechanical planarization process on the MTJ structure.

5. An apparatus for forming a magnetic tunnel junction (MTJ), the apparatus comprising:
    means for depositing a cap film layer onto an inter-metal dielectric layer of a substrate;
    means for forming a trench in the substrate;
    means for depositing an MTJ structure within the trench, the MTJ structure including a bottom electrode, a pinned layer, a tunnel barrier layer, a free layer, and a top electrode;
    means for removing material that is not directly over the trench; and
    means for planarizing the MTJ structure without performing a photo-etch on the MTJ structure.

6. The apparatus of claim 5, wherein the means for removing comprises means for applying a reverse photo etching process.

7. The apparatus of claim 5, further comprising means for performing a magnetic annealing process to define an orientation of a magnetic field carried by the pinned layer.

8. The apparatus of claim 5, further comprising means for forming a via using a photo-etch process, a photo-resist strip process, and a cleaning process on the cap film layer and on the inter-metal dielectric layer.

9. The apparatus of claim 8, further comprising:
    means for depositing conductive material within the via; and
    means for planarizing the substrate.

10. A method comprising:
    depositing a cap layer onto an inter-metal dielectric layer of a substrate;
    forming a trench in the substrate;
    depositing an MTJ structure within the trench, the MTJ structure including a bottom electrode, a pinned layer, a tunnel barrier layer, a free layer, and a top electrode;
    removing material that is not directly over the trench; and
    planarizing the MTJ structure without performing a photo-etch on the MTJ structure.

11. The method of claim 10, wherein removing the material comprises applying a reverse photo etching process.

12. The method of claim 10, further comprising performing a magnetic annealing process to define an orientation of a magnetic field carried by the pinned layer.

13. The method of claim 10, further comprising forming a via using a photo-etch process, a photo-resist strip process, and a cleaning process on the cap film layer and on the inter-metal dielectric layer.

14. The method of claim 13, further comprising:
    depositing conductive material within the via; and
    planarizing the substrate.

15. The method of claim 13, wherein planarizing the substrate comprises performing a chemical-mechanical planarization process on the substrate.

16. The method of claim 14, wherein the trench has a substantially rectangular shape.

17. The method of claim 10, wherein planarizing the MTJ structure comprises performing a chemical-mechanical planarization process on the MTJ structure.

* * * * *